(12) United States Patent
Wada et al.

(10) Patent No.: US 7,218,160 B2
(45) Date of Patent: May 15, 2007

(54) SEMICONDUCTOR INTEGRATED CIRCUIT

(75) Inventors: Tooru Wada, Osaka (JP); Masaya Sumita, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 34 days.

(21) Appl. No.: 10/922,176

(22) Filed: Aug. 20, 2004

(65) Prior Publication Data

US 2005/0040873 A1    Feb. 24, 2005

(30) Foreign Application Priority Data

Aug. 20, 2003    (JP)    ............................ P2003-296248

(51) Int. Cl.
*H03K 3/12*    (2006.01)
(52) U.S. Cl. .................. 327/200; 327/185; 327/197; 327/199; 326/95; 326/96; 326/97; 326/98
(58) Field of Classification Search ............. None
See application file for complete search history.

(56) References Cited

U.S. PATENT DOCUMENTS

| | | | |
|---|---|---|---|
| 5,596,544 A * | 1/1997 | Komarek et al. | 365/233.5 |
| 6,188,259 B1 * | 2/2001 | Amir et al. | 327/198 |
| 6,229,360 B1 * | 5/2001 | Mizuno et al. | 327/141 |
| 6,377,098 B1 * | 4/2002 | Rebeor | 327/210 |
| 6,577,176 B1 * | 6/2003 | Masleid et al. | 327/199 |
| 6,911,855 B2 * | 6/2005 | Yin et al. | 327/210 |
| 6,949,966 B2 * | 9/2005 | Suzuki | 327/158 |
| 6,959,061 B1 * | 10/2005 | Kuwata | 375/373 |
| 2006/0103432 A1 * | 5/2006 | Rajasekhar et al. | 327/34 |

FOREIGN PATENT DOCUMENTS

JP    2001-267889    9/2001

* cited by examiner

*Primary Examiner*—Tuan T. Lam
*Assistant Examiner*—Hiep Nguyen
(74) *Attorney, Agent, or Firm*—McDermott Will & Emery LLP

(57) ABSTRACT

A semiconductor integrated circuit according to the present invention comprises a latch circuit, a retaining circuit, and a feedback circuit, wherein the latch circuit inputs therein an input data signal, a clock signal and a feedback signal and outputs an output data signal, the retaining circuit retains the output data signal, and the feedback circuit inputs therein the input data signal and the output data signal to thereby generate the feedback signal based on logic combinations of the input data signal and the output data signal, and an internal operation of the latch circuit is turned on/off by means of the feedback signal.

27 Claims, 15 Drawing Sheets

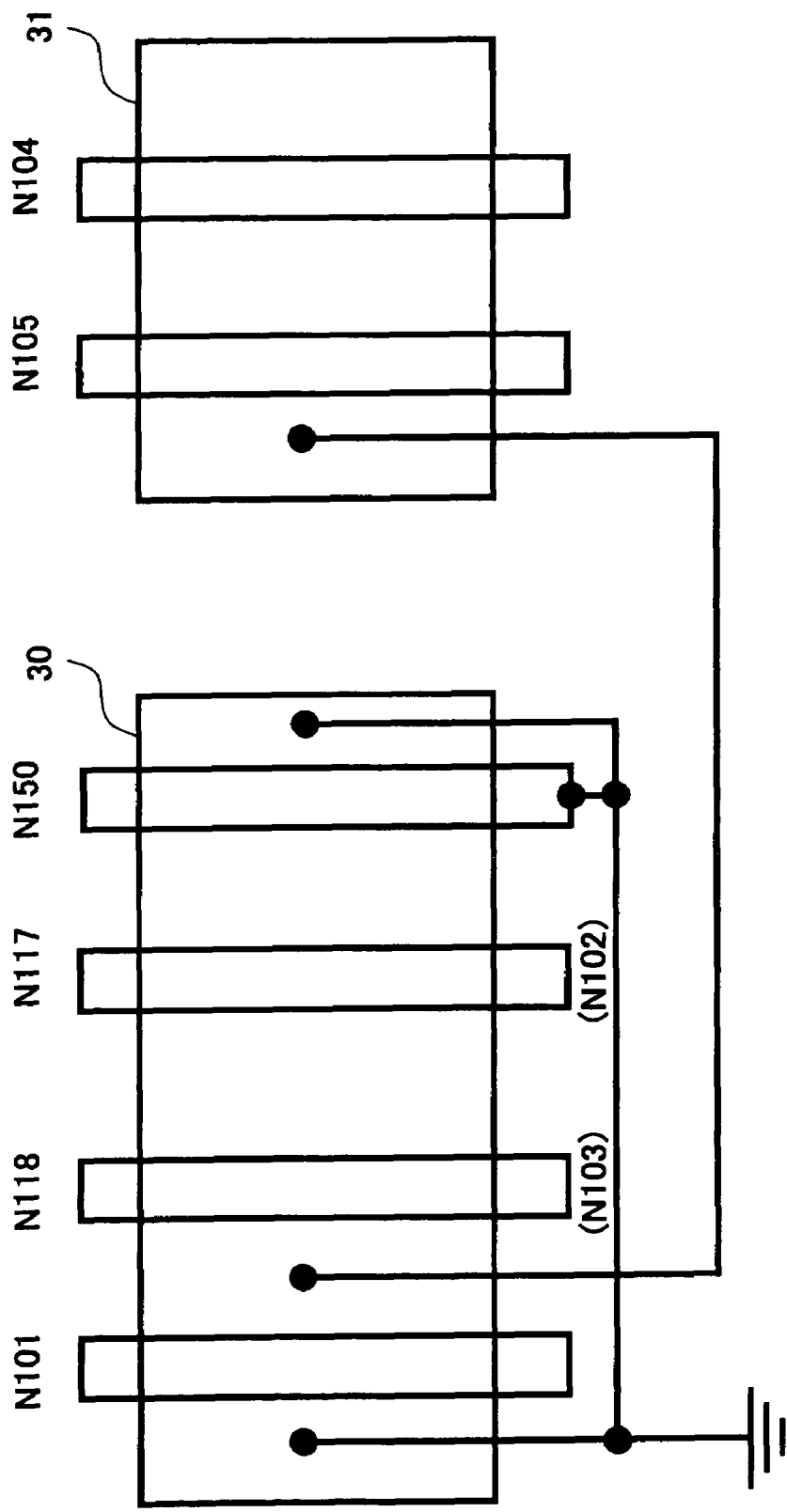
F I G. 8

F I G. 1 2
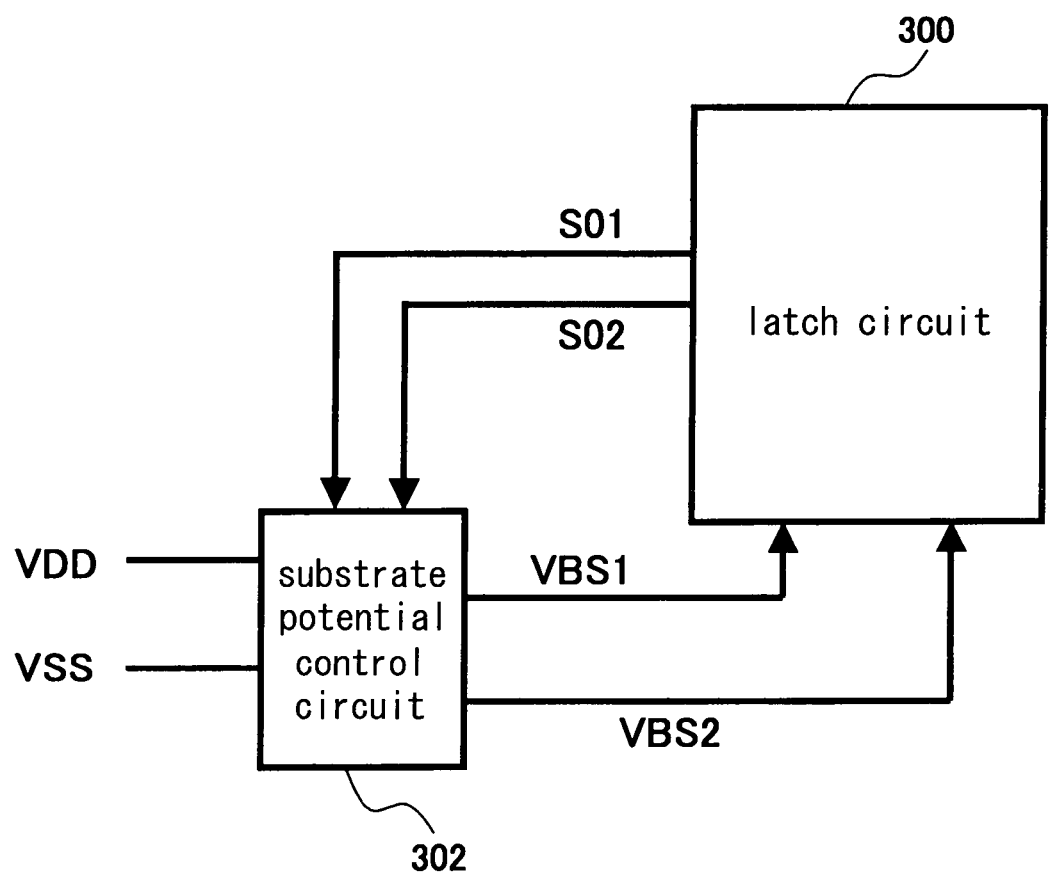

SEMICONDUCTOR INTEGRATED CIRCUIT

BACKGROUND OF THE INVENTION

1. Field of the Invention

The present invention relates to a semiconductor integrated circuit, more particularly to a technology for controlling unnecessary power consumption in a flip-flop circuit and further ensuring a high-speed operation when necessary.

2. Description of the Related Art

The range of a conventional D-flip-flop includes a dynamic type, static type, sense amplifier type and the like. FIG. 18 of IEEE Journal Of Solid-State Circuits, Vol. 34, No. 4, April, 1999, discloses a semi dynamic flip-flop, which represents a circuit example capable of realizing a high-speed operation therein. FIG. 13 of the present invention shows a D-flip-flop of the dynamic type as the circuit example thereof. The dynamic-type D-flip-flop consumes a large quantity of power even when an input data signal D and an output data signal NQ are in a same state, thereby resulting in a large mean current.

No. 2001-267889 of the Publication of the Unexamined Patent Applications discloses a circuit example achieving a reduced power consumption. The circuit example is a flip-flop of the static type attached by a clock signal control function. FIG. 14 shows an example of the static type D-flip-flop. In the static-type flip-flop circuit, an internal clock is halted when the input data signal D and output data signal Q are in a same state to thereby result in a reduced power consumption due to halting an internal operation. A problem in the static-type flip-flop circuit is that a setup time is large and an operation at a higher speed is difficult.

Abreast of an advancing miniaturization of semiconductor elements, a semiconductor substrate is provided with a sharow trench isolation region (Sharow Trench Isolation) in order to isolate respective transistors or circuit blocks. In forming the sharow trench isolation region, when a distortion is generated in a lattice constant of a molecular structure, which is a characteristic of a diffusion region constituting a source or drain of an MOS-type transistor, the diffusion region of the transistor formed in a neighboring area of the sharow trench isolation region is subject to a stress. The stress causes a mobility of an electric charge to be degraded, thereby resulting in a lower current capacity (Ids) and increased threshold voltage (Vth).

SUMMARY OF THE INVENTION

A semiconductor integrated circuit according to the present invention comprises:

a latch circuit, the latch circuit inputting therein an input data signal, clock signal, and feedback signal and outputting an output data signal;

a retaining circuit, the retaining circuit retaining the output data signal; and a feedback circuit, the feedback circuit inputting therein the input data signal and the output data signal and generating a feedback signal based on logic combinations of the input data signal and output data signal, wherein the signal transmission inside the logic circuits is controlled by means of the feedback signal regardless of whether the clock signal is discontinued.

The operation of the semiconductor integrated circuit having the foregoing configuration is described below. When the logic combinations of the input data signal and output data signal before and after the clock signal is in an asserted state are not different to each other, if the internal operation of the latch circuit is activated, it results in an unnecessary operation.

When the logic combinations of the input data signal and output data signal before and after the clock signal is asserted are not different to each other, the feedback circuit generates the feedback signal for turning off the internal operation of the latch circuit based on the logic combination.

The latch circuit halts the internal operation thereof in response to the feedback signal, except the clock signal supplied to the latch circuit, which is not halted. The operation of the semiconductor integrated circuit according to the present invention has its main objective in halting the internal operation of the latch circuit without halting the clock signal. In that manner, the power consumption can be reduced.

When the logic combinations of the input data signal and output data signal before and after the clock signal is asserted are different, the feedback signal from the feedback circuit asserts the internal operation of the latch circuit. The latch circuit accordingly restarts its internal operation, to thereby lead a fluctuation of the input data signal into a fluctuation of the output data signal. At that point, the clock signal is continuously being oscillated, thereby enabling a better setup responsiveness and high-speed operation. In brief, the lower power consumption and higher-speed operation, which were so far judged to be incompatible, can be simultaneously achieved.

The output data signal is additionally described below. In the case of the D-flip-flop, for example, the output data signal includes, with respect to the input data signal D and clock signal CK, a output data signal Q, and an output data signal NQ which is an inversion logic of the output data signal Q. When the output data signal is referred to in the present invention, one or both of the output data signal Q and output data signal NQ are represented, which is consistent in the following description.

The earlier-mentioned case, wherein "the logic combinations of the input data signal and output data signal before and after the clock signal is in the asserted state are not different to each other", includes, in terms of the first output data signal Q relative to the input data signal D, D="H", Q="H", and, D="L", Q="L", and in terms of the second output data signal NQ relative to the input data signal D, D="H", NQ="L", and, D="L" and Q="H".

Preferably, the feedback circuit is supplied with the input data signal and output data signal, and thereby generates a first feedback signal generated based on the output data signal, and a second feedback signal resulting from synthesizing the signal generated based on the output data signal and the input data signal.

BRIEF DESCRIPTION OF THE DRAWINGS

The present invention is illustrated by way of example and not limitation in the figures of the accompanying drawings, in which like references indicate similar elements and in which:

FIG. 8 is a plane view partially illustrating anther example of the semiconductor integrated circuit according to the embodiment 3.

FIG. 12 is a block diagram illustrating a configuration of a peripheral circuit of a substrate potential control circuit in the semiconductor integrated circuit according to the embodiment 5.

DETAILED DESCRIPTION OF THE PREFERRED EMBODIMENTS OF THE INVENTION

Figure 1:
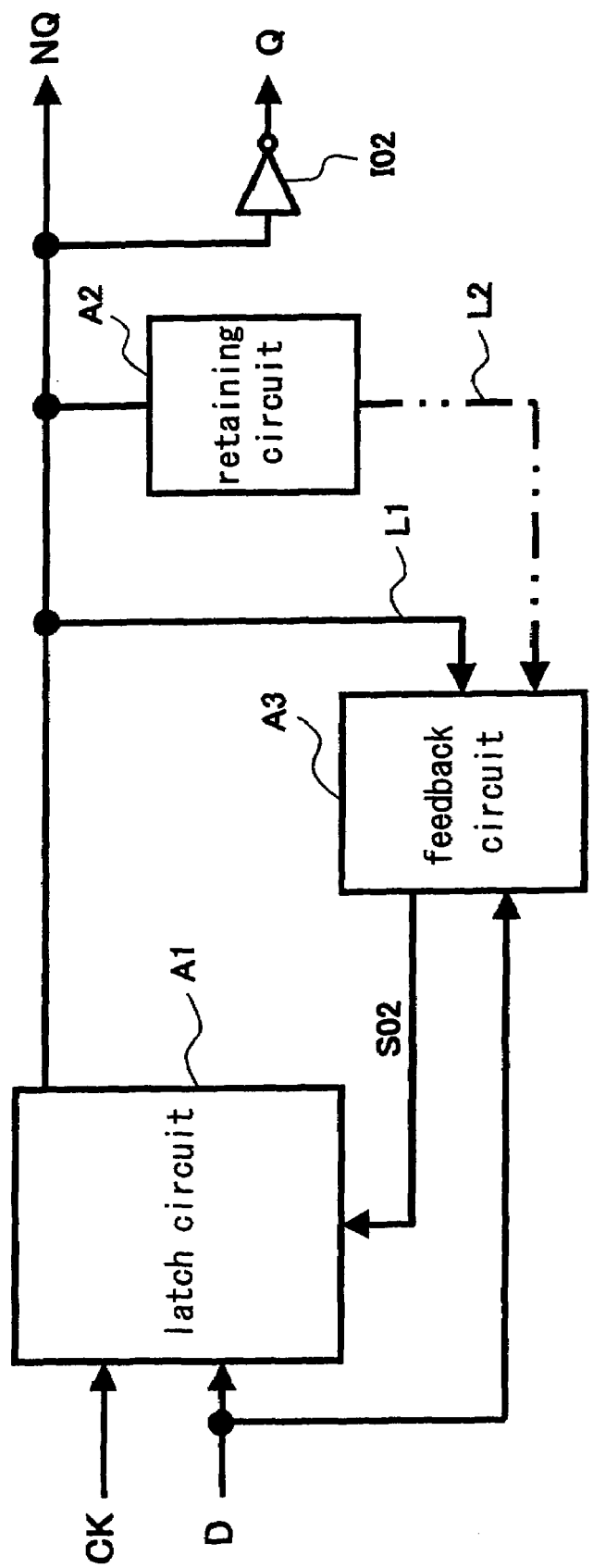
FIG. 1 is a block diagram illustrating a schematic configuration of a semiconductor integrated circuit according to an embodiment 1 of the present invention.

A semiconductor integrated circuit according to preferred embodiments of the present invention are described in detail referring to the drawings.

Embodiment 1

Figure 2:
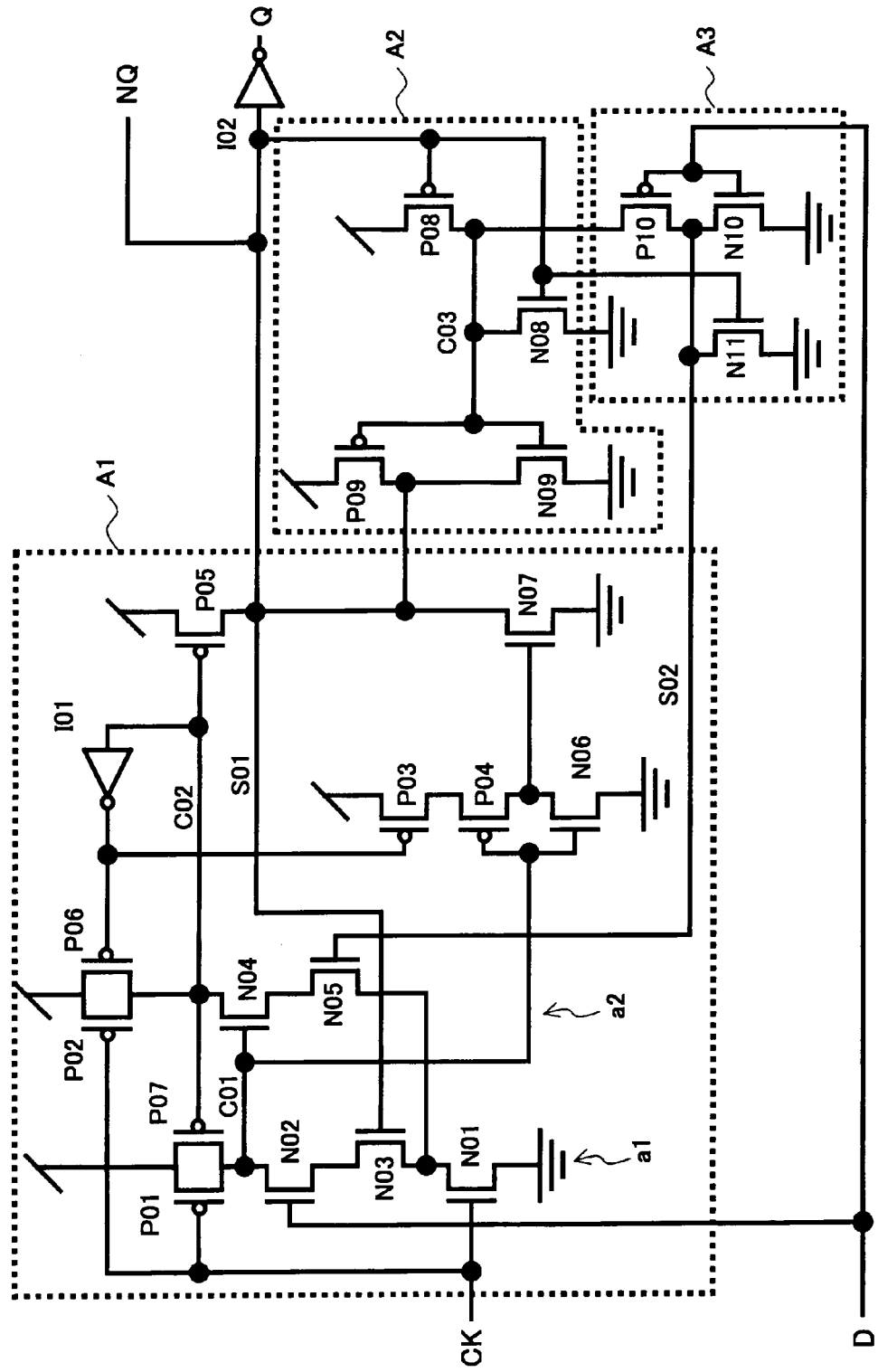
FIG. 2 is a circuit diagram illustrating an example of a specific configuration of the semiconductor integrated circuit according to the embodiment 1.
Figure 3:
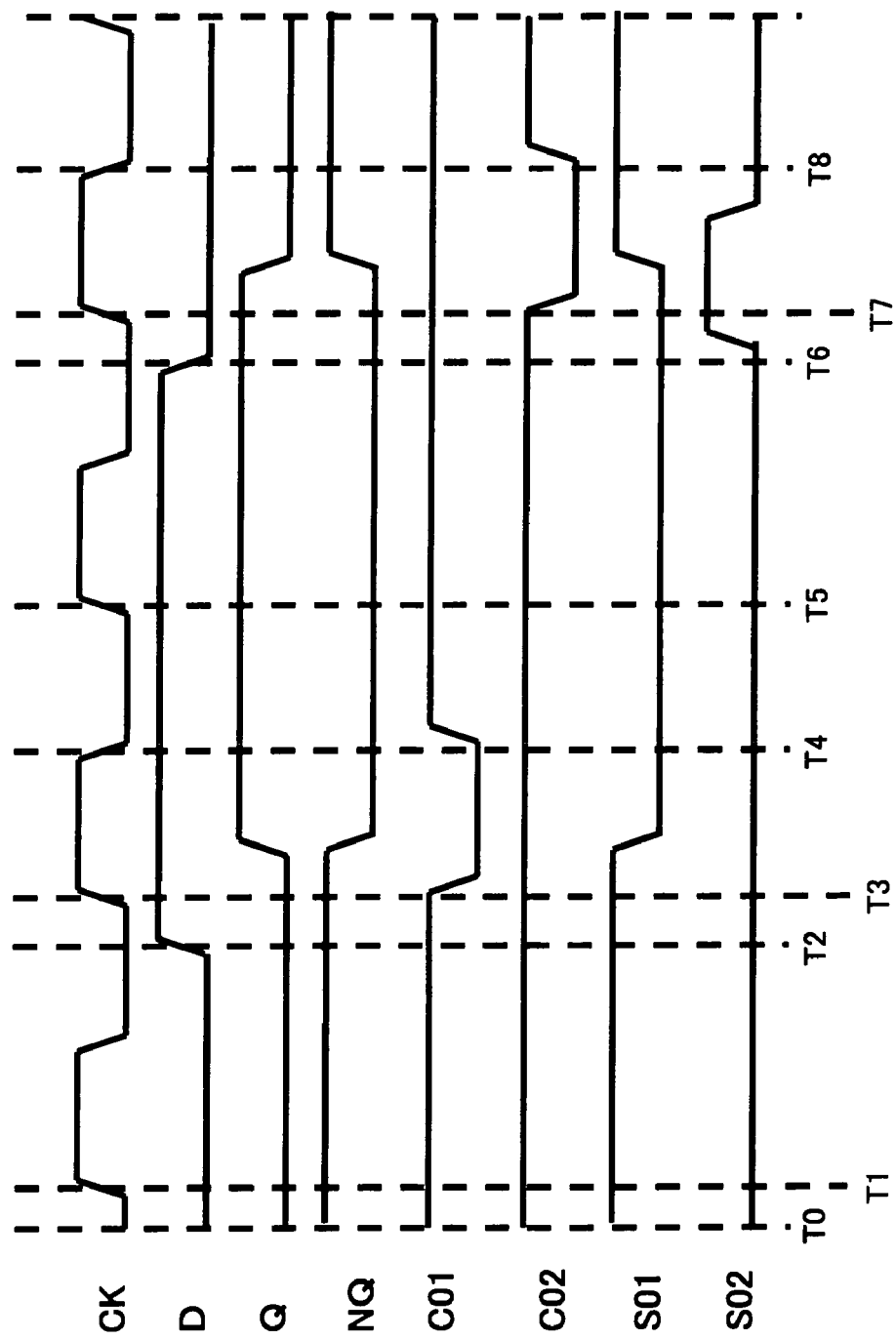
FIG. 3 is a waveform chart illustrating an operation of the semiconductor integrated circuit according to the embodiment 1.

FIGS. 1 through 3 show an embodiment 1 of the present invention.

Referring to FIG. 1, a reference symbol A1 denotes a latch circuit inputting therein an input data signal D, clock signal CK and feedback signals S01 and S02 and outputting an output data signal NQ. A reference symbol A2 denotes a retaining circuit retaining the output data signal NQ. A reference symbol A3 denotes a feedback circuit inputting therein the input data signal D and output data signal NQ and generating the feedback signal S02 based on logic combinations of the input data signal D and output data signal NQ. For input to the feedback circuit A3, a signal line L2 from the retaining circuit A2, as shown in a double-dotted chain line, may be employed in place of a signal line L1. A reference symbol 102 denotes an inverter.

FIG. 2 is a circuit diagram illustrating a specific configuration of the semiconductor integrated circuit of FIG. 1. Reference symbols P01–P10 denote P-type MOS transistors (Pch transistor), and N01–N11 denote N-type MOS transistors (Nch transistor). Reference symbols I01 and I02 respectively denote an inverter. The present semiconductor integrated circuit inputs therein the input data signal D and clock signal CK, and outputs a output data Q, and an output data signal NQ, which is an inversion logic of the output data signal Q. Reference symbols C01 and C02 denote precharge nodes, and C03 denotes a data retaining node. Reference symbols S01 and S02 denote feedback signals. The latch circuit A1 comprises a NAND-type dynamic circuit a1 and a NAND-type dynamic circuit a2.

The NAND-type dynamic circuit a1 is comprised of the Pch transistor P01, Nch transistor N02, Nch transistor N03, and Nch transistor N01, which are serially connected. To the NAND-type dynamic circuit a1 are inputted the input data signal D, clock signal CK, and feedback signal S01 from the feedback circuit A3, and the NAND-type dynamic circuit a1 controls charging/discharging with respect to the precharge node C01. The NAND-type dynamic circuit a1 charges the precharge node C01 during the period from a fall to rise of the clock signal CK (when the clock signal becomes the "L" level), discharges the charge of the precharge node C01 during the period from the rise to fall of the clock signal CK (when the clock signal becomes the "H" level) in the case in which the input data signal D and feedback signal S01 are both at the "H" level, and retains the charge of the precharge node C01 in the case in which one of the input data signal D and feedback signal S01 is at the "L" level.

The NAND-type dynamic circuit a2 is comprised of the Pch transistor P02, Nch transistor N04, Nch transistor N05, and Nch transistor N01, which are serially connected. To the NAND-type dynamic circuit a2 are inputted the precharge node C02, clock signal CK, and feedback signal S02 from the feedback circuit A3, and the NAND-type dynamic circuit a2 controls charging/discharging with respect to the precharge node C02. The NAND-type dynamic circuit a2 charges the precharge node C02 during the period from the fall to rise of the clock signal CK (when the clock signal becomes the "L" level), discharges the charge of the precharge node C02 during the period from the rise to fall of the clock signal CK (when the clock signal becomes the "H" level) in the case in which the precharge node C01 and feedback signal S02 are both at the "H" level, and retains the charge of the precharge node C02 in the case in which at least one of the precharge node C01 and feedback signal S02 is at the "L" level.

In order to execute the foregoing operation, the latch circuit A1 is comprised of a plurality of Pch transistors P01–P07, a plurality of Nch transistors N01–N07, and a single inverter I01. More specifics are as follows.

The latch circuit A1 comprises:

the Pch transistor P01, wherein a gate is connected to the clock signal CK, a source is connected to a power supply, and a drain is connected to the precharge node C01;

the Nch transistor N01, wherein a gate is connected to the clock signal CK and a source is grounded;

the Nch transistor N02, wherein a gate is connected to the input data signal D and a drain is connected to the precharge node C01;

the Nch transistor N03, wherein a gate is connected to the feedback signal S01, a drain is connected to a source of the Nch transistor N02, and a source is connected to a drain of the Nch transistor N01;

the Pch transistor P02, wherein a gate is connected to the clock signal CK, a source is connected to the power supply, and the drain is connected to the precharge node C02;

the Nch transistor N04, wherein a a gate is connected to the precharge node C01 and a drain is connected to the precharge node C02;

the Nch transistor N05, wherein a gate is connected to the feedback signal S02, a drain is connected to a source of the Nch transistor N04, and a source is connected to the drain of the Nch transistor N01;

the inverter I01, wherein an input terminal is connected to the precharge node C02;

the Pch transistor P03, wherein a gate is connected to an output terminal of the inverter I01 and a source is connected to the power supply;

the Pch transistor P04, wherein a gate is connected to the precharge node C01 and a source is connected to a drain of the Pch transistor P03;

the Nch transistor N06, wherein a gate is connected to the precharge node C01, a source is grounded, and a drain is connected to a drain of the Pch transistor P04;

the Pch transistor P05, wherein a gate is connected to the precharge node C02, a source is connected to the power supply, and a drain is connected to the output data signal NQ;

the Nch transistor N07, wherein a gate is connected to the drain of the Nch transistor N06, a source is grounded, and a drain is connected to the output data signal NQ;

the Pch transistor P06, wherein a gate is connected to the output terminal of the inverter I01, a source is connected to the power supply, and a drain is connected to the precharge node C02; and the Pch transistor P07, wherein a gate is connected to the precharge node C02, a source is connected to the power supply, and a drain is connected to the precharge node C01.

Referring to the foregoing configuration, the latch circuit A1 may be configured such that, in the case in which the feedback signal S01 and feedback signal S02 are the signals of the inversion logic, the Pch transistors are replaced by the Nch transistors, the Nch transistors are replaced by the Pch transistors, the power supplies are replaced by the grounds, and the grounds are replaced by the power supplies.

The retaining circuit A2 comprises:

the Pch transistor P08, wherein a gate is connected to the output data signal NQ and a source is connected to a power supply;

the Nch transistor N08, wherein a gate is connected to the output data signal NQ, a source is grounded, and a drain is connected to a drain of the Pch transistor P08;

the Pch transistor P09, wherein a gate is connected to the drain of the Nch transistor N08, a source is connected to the power supply, and a drain is connected to the feedback signal S01; and the Nch transistor N09, wherein a gate is connected to the drain of the Nch transistor N08, a source is grounded, and a drain is connected to the feedback signal S01.

To the feedback circuit A3 are inputted the input data signal D and output data signal NQ. The feedback circuit A3 generates the feedback signal S02 by means of the signal generated based on the output data signal NQ and input data signal D.

The feedback circuit A3 specifically comprises:

the Pch transistor P10, wherein a gate is connected to the input data signal D, a drain is connected to the feedback signal S02 and a source is connected to the drain of the Pch transistor P08;

the Nch transistor N10, wherein a gate is connected to the input data signal D, a drain is connected to the feedback signal S02, and a source is grounded; and the 11th Nch transistor N11, wherein a gate is connected to the output data signal NQ, a drain is connected to the feedback signal S02, and a source is grounded.

The feedback signal S01 internally generated and outputted by latch circuit A1 is a signal of logic inversion resulting from the logic inversion of the output data signal NQ. The feedback signal S01 serves to control permission/prohibition of the discharge with respect to the NAND-type dynamic circuit a1, and is connected to the gate of the Nch transistor N03. The feedback signal S02 generated and outputted by the feedback circuit A3 is generated based on the input data signal D and output data signal NQ. The feedback signal S02 serves to control permission/prohibition of the discharge with respect to the NAND-type dynamic circuit a2, and is connected to the gate of the Nch transistor N05. The feedback signal S02 is always at the "L" level when the output data signal Q is at the "L" level. The feedback signal S02 is still at the "L" level when the output data signal Q is at the "H" level and the input data signal D is also at the "H" level, and changed to the "H" level when the input data signal D is at the "L" level. Though the output data signal Q and output data signal NQ are shown in FIG. 2, there is no problem in providing either the output data signal Q alone or output data signal NQ alone.

FIG. 3 is a waveform chart illustrating an operation of the semiconductor integrated circuit configured as in FIG. 2.

1) At time T0, the clock signal CK is at the "L" level, and the Pch transistors P01 and P02 are turned on, while the Nch transistor N01 is turned off. At that time, the input data signal D and output data signal Q are both at the "L" level. The output data signal NQ is at the "L" level, the data retaining node C03 is at the "L" level, and the feedback signal S01 is at the "H" level, therefore the Nch transistor N03 is in the ON state. However, the Nch transistor N02 is in the OFF state because the input data signal D is at the "L" level, and further, the Nch transistor N01 is also in the OFF state because of the clock signal CK at the "L" level. Accordingly, the precharge node C01 is precharged to the "H" level. The Nch transistor N11 is in the ON state because of the output data signal NQ at the "H" level, while the Nch transistor N05 is in the OFF state because of the feedback signal S02 at the "L" level. The Nch transistor N04 is in the ON state because of the precharge node C01 at the "H" level, whereas the Nch transistor N05 is in the OFF state, therefore the precharge node C02 is precharged to the "H" level.

As describe above, the precharge node C01 and precharge node C02 are both precharged to the "H" level at the time T0. Below is described the state of the rest of the configuration at the time of the precharge. The output of the inverter I01 is at the "L" level because of the precharge node C02 at the "H" level, as a result of which the Pch transistors P06 and P03 are in the ON state. Further the Pch transistors P07 and 05 are in the OFF state. The Nch transistor N06 is in the ON state because the precharge node C01 is at the "H" level, and the Pch transistor P04 is OFF. The Nch transistor N07 is OFF because the Nch transistor N06 is in the ON state and connected to the ground. The Pch transistor P08 is OFF because the output data signal NQ is at the "H" level, and the Nch transistor N08 is in the ON state. The Pch transistor P10 is ON because of the input data signal D at the "L" level, and the Nch transistor N10 is in the ON state. The Pch transistor P09 is ON because the Nch transistor N08 is ON and connected to the ground, and the Nch transistor N09 is OFF. The data retaining node C03 in the data retaining circuit A2 is at the "L" level.

2) It is assumed that the clock signal CK rises at the "H" level at time T1. The input data signal D is then at the "L" level, and the output data signal Q is at the "L" level. To put it differently, the input data signal D and output data signal Q both serve as conditions for halting the internal operation of the latch circuit at the "L" level. The Pch transistors P01 and P02 are both inverted to OFF, while the Nch transistor N01 is inverted to ON. The Nch transistor N02 remains the OFF state because the input data signal D stays at the "L" level. Therefore, the precharge node C01 is not discharged, and remains the "H" level retaining the charge. Meanwhile, the Nch transistor N05 keeps its OFF state because the feedback signal S02 stays at the "L" level. Therefore, the precharge node C02 is not discharge, and remains the "H" level retaining the charge. The Pch transistor P05 and Nch transistor N07 in an output stage of the latch circuit A1 both remain the OFF state. Therefore, the output data signal NQ and output data signal Q remain the same state, and the feedback signal S01 and feedback signal S02 stay the same.

When the output data signal Q is at the "L" level, and the input data signal D is at the "L" level, a result obtained by the rise of the clock signal CK is the "L" level, which is the same as the original state of the output data signal Q, meaning that the halt of the internal operation of the latch circuit leads to the same result. The halt of the internal operation of the latch circuit achieves the reduction of the power consumption. Importantly, the internal operation of the latch circuit is halted by means of, not the discontinued supply of the clock signal CK, but the control of the signal transmissions inside a logic circuit. This accelerates a response speed in 4) after the cancellation of the conditions for halting the internal operation of the latch circuit, which is described in 3) below.

3) It is assumed that the input data signal D rises from the "L" level to the "H" level at Time T2. The logic combinations of the input data signal D and output data signal Q results in inconsistency, and the conditions for halting the internal operation of the latch circuit are thereby cancelled.

4) Then, it is assumed that the clock signal CK rises to the "H" level at time T3. When the input data signal D is inverted to the "H" level, the Nch transistor N10 is turned on, while the feedback signal S02 stays at the "L" level. Further, the Nch transistor N02 is turned on in response to the inversion of the input data signal D to the "H" level. At that time, the Nch transistor N03 is in the ON state because the feedback signal S01 is already at the "H" level, and the Nch transistor N01 is in the ON state in response to the rise of the clock signal CK. Accordingly, the precharge node C01 is connected to the ground and thereby discharged.

When the precharge node C01 goes to the "L" level as a result of the discharge, an influence therefrom is transmitted to the Nch transistors N06 and N04.

The Nch transistor N06 is inverted to the OFF state, while the Pch transistor P04 is inverted to the ON state. Because of the Pch transistor P03 in the ON state, the gate of the Nch transistor N07 is inverted to the "H" level, thereby leaving the Nch transistor N07 in the ON state. The output state of the latch circuit A1 is accordingly switched over. More specifically, because the Nch transistor N07 is connected to the ground, the output data signal NQ is inverted to the "L" level from the past "H" level. Correspondingly, the output data signal Q is inverted from the "L" level to the "H" level. The output data signal Q is consequently at the "H" level as well as the input data signal D. At the same time, the feedback signal S01 is inverted to the "L" level. When the feedback signal S01 goes to the "L" level, the Nch transistor N03 returns to the OFF state, and the precharge node C01 is in a charge-permission standby state.

The Nch transistor N04 is OFF in accordance with the inversion of the precharge node C01 to the "L" level. The precharge node C02 is at the "H" level retaining the charge.

The inversion of the output data signal NQ to the "L" level is retained in the data retaining circuit A2. The output of the inverter (P08 and N08) is inverted, and the data retaining node C03 is inverted to the "H" level. The output of the inverter (P09 and N09) is kept at the "L" level.

As described, when the input data signal D is inverted from the "L" level to the "H" level, in the state of which the clock signal CK rises, the output data signal Q is inverted from the "L" level to the "H" level. More specifically, the internal operation of the latch circuit is restarted at a high speed in response to the rise of the clock signal CK after the conditions for halting the internal operation of the latch circuit are cancelled, which is because of the continuous oscillation of the clock signal CK.

The operation during the foregoing period establishes the conditions for halting the internal operation of the latch circuit that the input data signal D and output data signal Q are both at the "H" level.

5) When the clock signal CK falls to the "L" level at time T4, the Pch transistors P01 and P02 are tuned on, and the precharge node C01, which was at the "L" level immediately prior thereto, is precharged to the "H" level. At that time, the Nch transistor N03 is in the OFF state because the feedback signal S01 is at the "L" level, thereby compensating for the precharge. Further, the supplementary charge is supplied to the precharge node C02.

6) The clock signal CK rises to the "H" level at time T5. At that time, the input data signal D and output data signal Q are both at the "H" level, meaning that the conditions for halting the internal operation of the latch circuit are established. In response to the rise of the clock signal CK, the Pch transistors P01 and P02 are inverted to OFF, while the Nch transistor N01 is inverted to ON. Further, the Nch transistor N02 is in the ON state because the input data signal D is at the "H" level. The Nch transistor N03 remains the OFF state because of the feedback signal S01 staying at the "L" level. Therefore, there is no discharge with respect to the precharge node C01, which remains the "H" level retaining the charge. In contrast to that, the Nch transistor N05 is continuously in the OFF state because of the feedback signal S02 at the "L" level. Therefore, there is no discharge with respect to the precharge node C02, which stays at the "H" level retaining the charge. Accordingly, the Pch transistor P05 and Nch transistor N07 in the output stage of the latch circuit A1 are both continuously in the OFF state. Hence, the output data signal NQ and output signal Q are still in the same state, and the feedback signal S01 and feedback signal S02 stay the same.

Compared to 4), in 4), the precharge node C01 is discharged in response to the rise of the clock signal CK, which results in the active operation of the latch circuit A1 because of the cancellation of the conditions for halting the internal operation of the latch circuit that the input data signal D is at the "H" level and output data signal Q is at the "L" level immediately prior to the rise of the clock signal CK.

In the case of 6), neither the precharge node C01 nor precharge node C02 is discharged despite the rise of the clock signal CK, which results in the halt of the latch circuit because of the establishment of the conditions for halting the internal operation of the latch circuit that the input data signal D and output data signal Q are both at the "H" level immediately prior to the rise of the clock signal CK.

When the output data signal Q is at the "H" level, and the input data signal D is at the "H" level, the result obtained from the rise of the clock signal CK is the "H" level, which is the same as the original state of the output data signal Q, meaning that the halt of the internal operation of the latch circuit leads to the same result. The halt of the internal operation of the latch circuit can achieve the reduction of the power consumption. Importantly, the internal operation of the latch circuit is halted by means of, not the discontinued supply of the clock signal CK, but the control of the signal transmissions inside the logic circuit. This accelerates the response speed in 7) after the cancellation of the conditions for halting the internal operation of the latch circuit in 6), which is described below.

7) It is assumed that the input data signal D falls from the "H" level to the "L" level at Time T6. The logic combinations of the input data signal D and output data signal Q results in inconsistency, and the conditions for halting the internal operation of the latch circuit are thereby cancelled. In that manner, the Nch transistor N10 is inverted to the OFF state, while the Pch transistor P10 is inverted to the ON state. The Pch transistor P08 is already in the ON state, therefore the feedback signal S02 is inverted from the "L" level to the "H" level. As a result, the Nch transistor N05 is inverted to the ON state. Then, a discharge-permission standby state arrives. However, because the clock signal CK is at the "L" level, the Pch transistor P02 is in the ON state, and the Pch transistor P06 is also in the ON state, the precharge node C02 is still continuously charged.

8) It is assumed that the clock signal CK rises to the "H" level at time T7. The Pch transistor P01 is turned off, and charging the precharge node C02 is discontinued. Though the Nch transistor N01 is turned on, the Nch transistor N03 maintains its ON state because the feedback signal S01 is at the "L" level. The precharge node C01 is at the "H" level retaining the charge. Meanwhile, the Pch transistor P02 is turned off, charging the precharge node C02 is also discontinued. At that time, the feedback signal S02 is already inverted to the "H" level, and in conjunction with the inversion, the Nch transistor N05 is switched over to the ON state. The Nch transistor N04 is originally in the ON state, and the Nch transistor N01 is already turned on in response to the rise of the clock signal CK, therefore the precharge node C02 starts to discharge. When the potential of the precharge node C02 descends, and the output of the inverter I01 is inverted to the "H" level, the Pch transistor P06 is turned off, resulting in a rapid drop of the potential of the precharge node C02.

When the precharge node C02 goes to the "L" level as a result of the foregoing discharge, the Pch transistor P05 is inverted to the ON state. The Nch transistor N07 is still in the ON state. Hence, the output state of the latch circuit A1 is switched over. More specifically, the output data signal NQ is inverted from the past "L" level to the "H" level since the Pch transistor P05 is connected to a power supply potential VDD. Correspondingly, the output data signal Q is inverted from the "H" level to the "L" level. This results in the establishment of the conditions for halting the internal operation of the latch circuit that the input data signal D and output data signal Q are both at the "L" level. At the same time, the feedback signal S01 is inverted to the "H" level.

When the feedback signal S01 goes to the "H" level, the Nch transistor N03 is returned to the ON state, leaving the precharge node C01 in the discharge-permission standby state. In response to the inversion of the precharge node C02 to the "L" level, the Pch transistor P07 is turned on, and the precharge node C01 is thereby additionally charged.

The inversion of the output data signal NQ to the "H" level is retained in the data retaining circuit A2. The output of the inverter (P08 and N08) is inverted, thereby inverting the data retaining node C03 to the "L" level. The output of the inverter (P09 and N09) is kept at the "H" level.

As described, when the input data signal D is inverted from the "H" level to the "L" level, in the state of which the clock signal CK rises, the output data signal Q is inverted from the "H" level to the "L" level. This is because the conditions for halting the internal operation of the latch circuit (input data signal D and output data signal Q are both at "H" level) are previously cancelled.

When the output data signal NQ is inverted to the "H" level, and the feedback signal S01 goes to the "H" level, the Nch transistor N03 is inverted to the ON state, leaving the precharge node C01 in the discharge-permission standby state.

Further, in response to the inversion of the output data signal NQ to the "H" level, the Nch transistor N11 in the feedback circuit A3 is inverted to the ON state, and the feedback signal S02 is inverted from the "H" level to the "L" level. Then, the Nch transistor N05 is accordingly inverted to the OFF state, leaving the precharge node C02 in the charge-permission standby state.

9) It is assumed that the clock signal CK rises to the "L" level at time T8. The Pch transistors P01 and P02 are turned on, and the precharge node C02, which was at the "L" level immediately prior thereto, is precharged to the "H" level. At that time, the Nch transistor N05 is in the OFF state because the feedback signal S02 is at the "L" level, thereby compensating for the precharge. The precharge node C01 is also supplied with the additional charge. At this point, the state of 1) at the time T0 is regained.

The summary of the present embodiment described so far is as follows.

When the conditions for halting the internal operation of the latch circuit that the input data signal D and output data signal Q are both at the "L" level or "H" level are established, the internal operation of the latch circuit A1 can be halted irrespective of the fluctuation of the clock signal CK to thereby achieve a low power consumption. Further, because the internal operation of the latch circuit A1 is halted along with the continuous oscillation of the clock signal CK, the logic combination is either "H" and "L", or "L" and "H", thereby achieving the accelerated setup after the cancellation of the conditions for halting the internal operation of the latch circuit.

The high-speed operation of the semiconductor integrated circuit according to the present invention is verified using a circuit simulation data.

A limit value for the setup is defined as a delay by 5% compared to a delay value obtained by clock signal CK minus output data signal NQ when the value of the input data signal D is determined with a sufficient length of time prior to the rising edge of the clock signal CK. Then, the delay states of the input data signal D and output data signal NQ when the input data signal D is determined at the setup limit value is verified.

Conditions for the simulation are set as follows.

Figure 13:
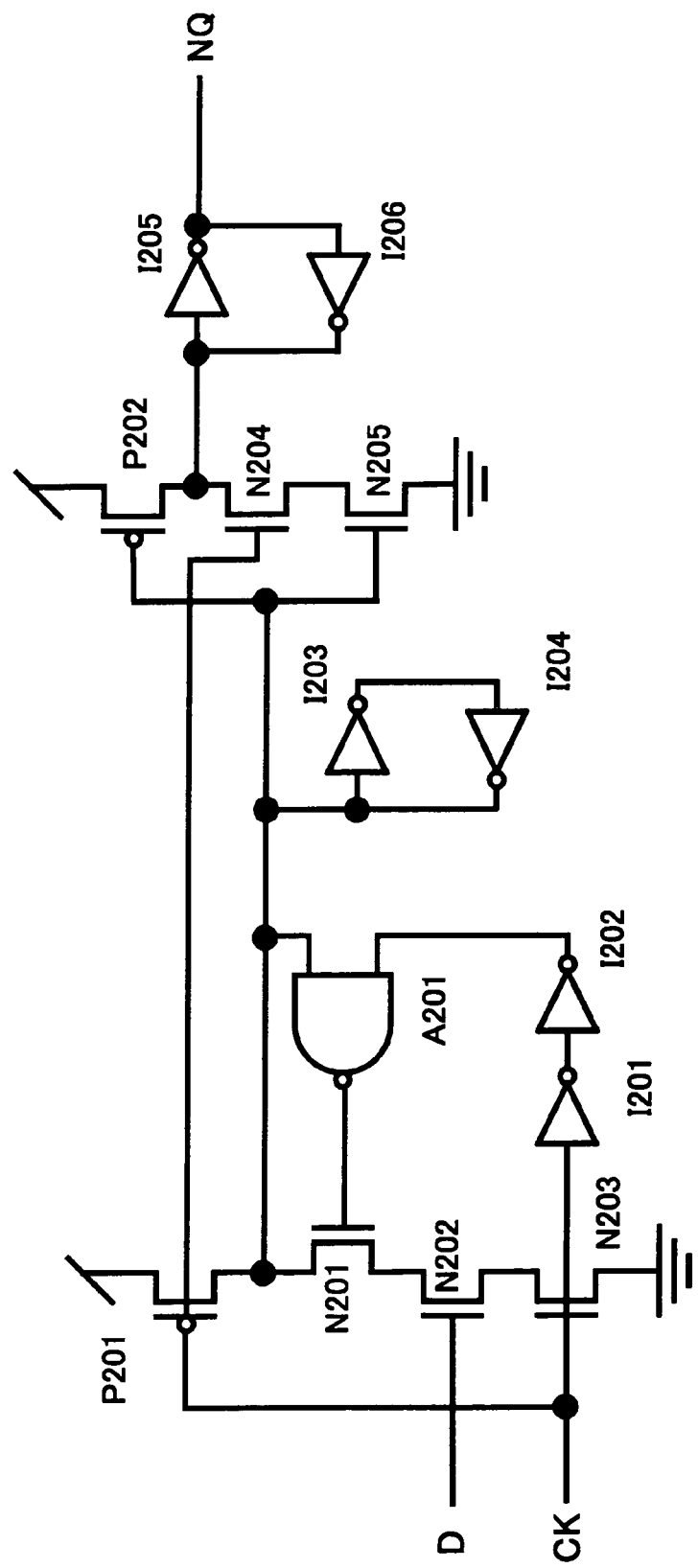
FIG. 13 is a circuit diagram illustrating a configuration of a semiconductor integrated circuit according to a conventional technology.
Figure 14:
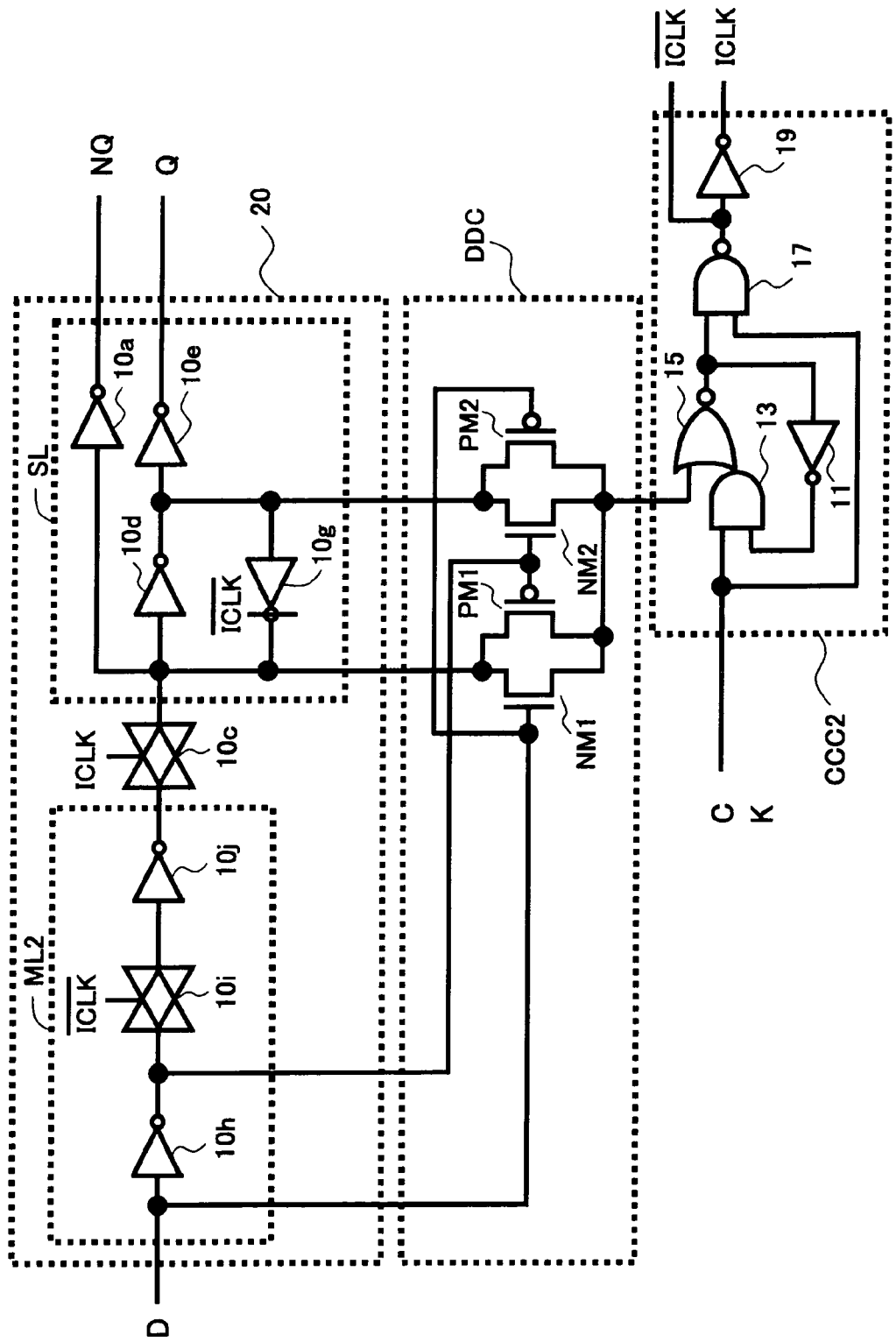
FIG. 14 is a circuit diagram illustrating a configuration of another semiconductor integrated circuit according to the conventional technology.

In FIGS. 2, 13 and 14, a saturation current per unit width in all the Nch transistors is set to 380 µA/µm, and a threshold voltage thereof is set to 300 mV. A saturation current per unit width in all the Pch transistors is set to 160 µA/µm, and a threshold voltage thereof is set to −300 mV. The power supply voltage VDD is set to 1.3V, and a channel length of all the transistors is set to 0.12 µm.

Further, the following assumption is provided for the configuration of FIG. 2.

The transistors having the channel width of 2 µm are the Nch transistors N01, N02, N03, N04, N05 and N07, and Pch transistors P08 and P10. The transistors having the channel width of 0.4 µm are the Nch transistors N06, N08, N09, N10, and N11, and Pch transistors P01, P02, P06, P07 and P09. The transistors having the channel width of 1.6 µm are the Pch transistors P03 and P04. The transistor having the channel width of 1.6 µm is the Pch transistor P05.

Regarding the inverters, the Pch transistors of the inverter I01 have the channel width of 0.8 µm, the Nch transistors of the inverter I01 have the channel width of 0.4 µm, the Pch transistors of the inverter I02 have the channel width of 5.4 µm, and the Nch transistors of the inverter I02 have the channel width of 3.2 µm.

The configuration shown in FIG. 18 of IEEE Journal Of Solid-State Circuits, Vol. 34, No. 4, April, 1999 is shown in FIG. 13 of the present invention for which the following assumption is provided. An Nch transistor N201 has the channel width of 3.6 µm. An Nch transistor N202 has the channel width of 4.9 µm. An Nch transistor N203 has the channel width of 5.5 µm. An Nch transistor N204 has the channel width of 1.7 µm. An Nch transistor N205 has the channel width of 1.7 µm. A Pch transistor P201 has the channel width of 0.8 µm. A Pch transistor P202 has the channel width of 5.5 µm. A Pch transistor of an inverter I201 has the channel width of 1.16 µm. An Nch transistor of the inverter I201 has the channel width of 0.6 µm. A Pch transistor of an inverter I202 has the channel width of 0.8 µm. An Nch transistor of the inverter I202 has the channel width of 0.4 µm. A Pch transistor of an inverter I203 has the channel width of 0.4 µm. An Nch transistor of the inverter I203 has the channel width of 0.4 µm. A Pch transistor of an inverter I204 has the channel width of 0.4 µm. An Nch transistor of the inverter I204 has the channel width of 1.2 µm. Pch transistors of an inverter I205 have the channel width of 5.4 µm. An Nch transistor of the inverter I205 has the channel width of 3.1 µm. A Pch transistor of an inverter I206 has the channel width of 0.6 µm. An Nch transistor of the inverter I206 has the channel width of 0.4 µm. Two Pch transistors of an AND gate A201 have the channel width of 0.5 µm. Two Nch transistors of the AND gate A201 have the channel width of 1.9 µm.

In FIG. 14, A Pch transistor of an inverter 10h has the channel width of 0.8 µm. An Nch transistor of the inverter 10h has the channel width of 0.4 µm. A Pch transistor of a transmission gate 10i has the channel width of 1.0 µm. An Nch transistor of the transmission gate 10i has the channel width of 0.5 µm. A Pch transistor of an inverter 10j has the channel width of 1.6 µm. An Nch transistor of the inverter 10j has the channel width of 0.8 µm. A Pch transistor of a transmission gate 10c has the channel width of 2.0 µm. An Nch transistor of the transmission gate 10c has the channel width of 1.0 µm. A Pch transistor of an inverter 10d has the channel width of 1.6 µm. An Nch transistor of the inverter 10d has the channel width of 0.8 µm. A Pch transistor of an inverter 10e has the channel width of 5.2 µm. An NchS transistor of the inverter 10e has the channel width of 3.2 µm. A Pch transistor of an inverter 10a has the channel width of 5.2 µm. An Nch transistor of the inverter 10a has the channel width of 3.2 µm. Two Pch transistors of a clocked inverter 10g have the channel width of 0.4 µm. Two Nch transistors of the clocked inverter 10g have the channel width of 0.4 µm. A Pch transistor PM1 has the channel width of 1.5 µm. A Pch transistor PM2 has the channel width of 1.5 µm. An Nch transistor NM1 has the channel width of 1.0 µm. An Nch transistor NM2 has the channel width of 1.0 µm. A Pch transistor of an inverter 11 has the channel width of 0.4 µm. An Nch transistor of the inverter 11 has the channel width of 0.4 µm. Three Pch transistors of an AND gate 13 have the channel width of 0.4 µm. Three Nch transistors of the AND gate 13 have the channel width of 0.4 µm. Two Pch transistors of an NOR gate 15 have the channel width of 0.8 µm. Two Nch transistors of the NOR gate 15 have the channel width of 0.4 µm. Two Pch transistors of an NAND gate 17 have the channel width of 0.4 µm. Two Nch transistors of the NAND gate 17 have the channel width of 0.4 µm. Two Pch transistors of an inverter 19 have the channel width of 1.6 µm. Two Nch transistors of the inverter 19 have the channel width of 0.8 µm.

As a result of the circuit simulation based on the conditions set as above, the delay time from the time when the input data signal D rises until the time when the output data signal NQ rises in FIG. 2 was 320 ps, while the delay time from the time when the input data signal D falls until the time when the output data signal NQ falls was 460 ps.

In contrast to the foregoing result, the delay time from the time when the input data signal D rises until the time when the output data signal NQ rises in FIG. 13 was 720 ps, while the delay time from the time when the input data signal D falls until the time when the output data signal NQ falls was 500 ps.

Further, the delay time from the time when the input data signal D rises until the time when the output data signal NQ rises in FIG. 14 was 890 ps, while the delay time from the time when the input data signal D falls until the time when the output data signal NQ falls was 890 ps.

As described, in the circuit configuration of the latch circuit according to the embodiment 1 of the present invention, the second stage of a dynamic D-flip-flop, which is originally of a static type, is replaced by the same of the dynamic NAND type, and the feedback circuit is serially provided with the Nch transistors in the data input units of the first and second stages. When the input data signal D and output data signal Q are in the same state, the internal operation of the latch circuit is halted based on the logics of the input data signal D and output data signal Q to thereby reduce the power consumption and further maintain the high-speed operation of the dynamic circuit itself.

The circuit configuration of the latch circuit according to the embodiment 1 of the present invention, in addition to the described effects, has the advantage that the latch circuit A1 is still operable when the voltage level of the clock signal CK is lower than the operation voltage of the latch circuit A1 with no flow of any stationary through current. The reason for that is described referring to FIGS. 2 and 3.

At time T3, in the case in which the voltage value of the clock signal CK at the logic "H" level is low, however only exceeds the threshold level of the Nch transistor N01 when the capabilities of the precharging Pch transistors P01 and P02 are poor, the Nch transistors N02 and N03 are in the ON state. Accordingly, the precharge node C01 is discharged. In the foregoing state, the Pch transistor P01 is not completely turned off, allowing the Nch transistors N02 and N03 to be in the ON state, thereby generating the through current.

However, the Nch transistor N03 is immediately turned off to thereby stop the through current.

Further, at time T7, in the case in which the voltage value of the clock signal CK at the logic "H" level is low, however only exceeds the threshold level of the Nch transistor N01 when the capabilities of the precharging Pch transistors P01 and P02 are poor, the Nch transistors N04 and N05 are in the ON state. Accordingly, the precharge node C02 is discharged. In the foregoing state, the Pch transistor P02 is not completely turned off, allowing the Nch transistors N04 and N05 to be in the ON state, thereby generating the through current. However, the Nch transistor N05 is immediately turned off to thereby stop the through current.

As described, in the circuit configuration shown in FIG. 2, the oscillation width of the clock can be reduced to thereby cut down on the charge/discharge energy. Thus, the power consumption in the semiconductor integrated circuit can be further reduced.

Embodiment 2

Figure 4:
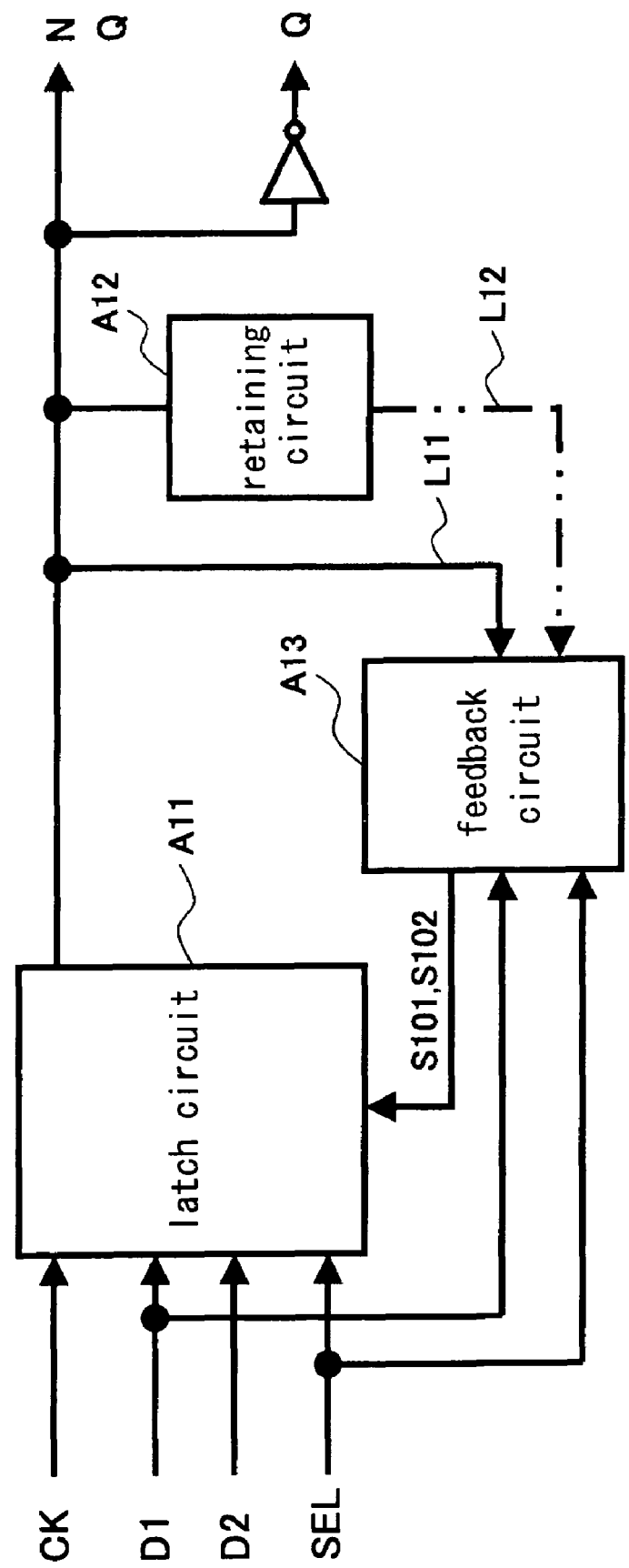
FIG. 4 is a block diagram illustrating a schematic configuration of a semiconductor integrated circuit according to an embodiment 2 of the present invention.

FIG. 4 is a block diagram illustrating a schematic configuration of a semiconductor integrated circuit according to an embodiment 2 of the present invention. Reference symbols A11, A12 and A13 respectively denote a latch circuit, data retaining circuit, and feedback circuit. A signal line L12, which is shown in a double-dotted chain line, may be used for input to the feedback circuit A13 in place of a signal line L11.

Figure 5:
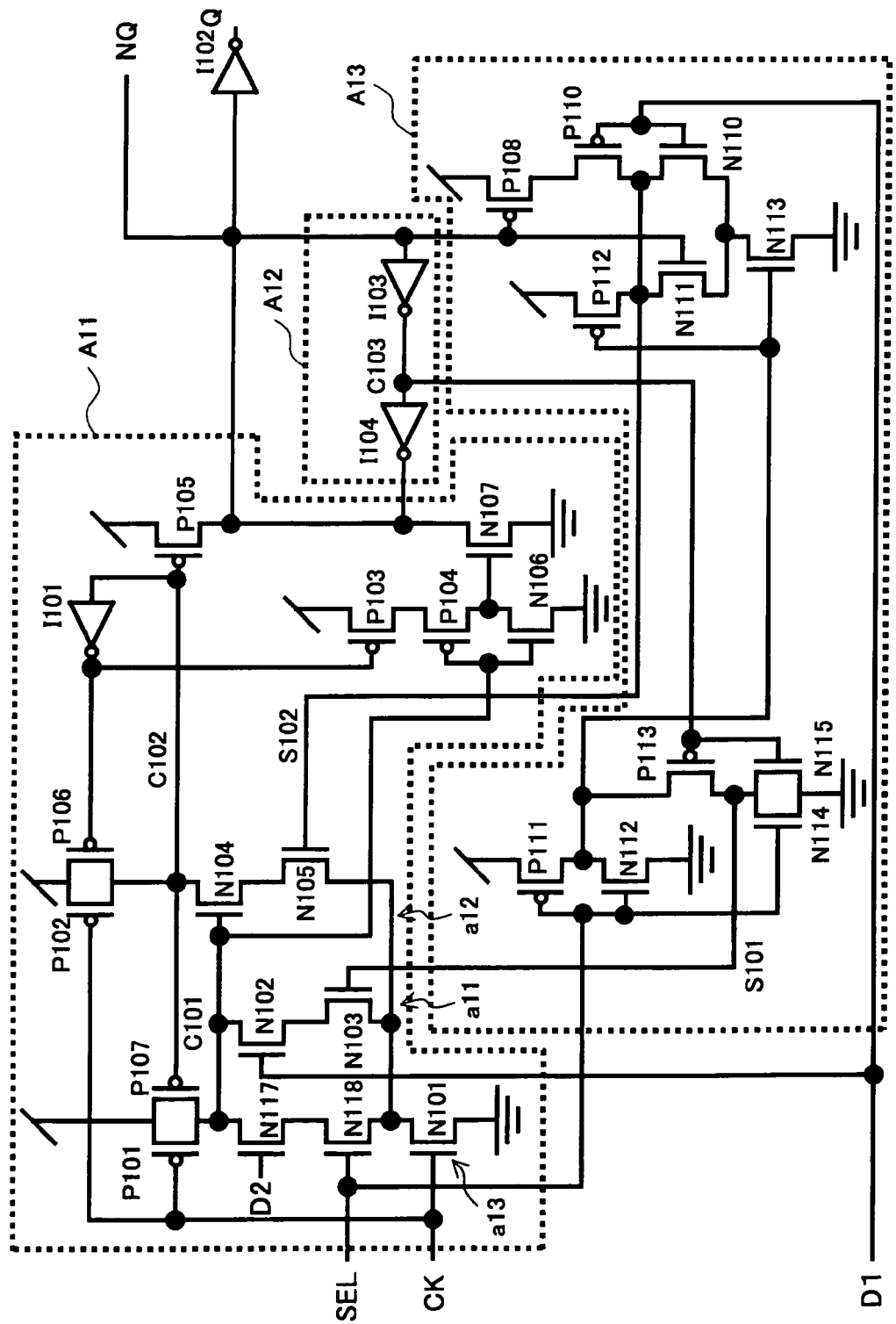
FIG. 5 is a circuit diagram illustrating an example of a specific configuration of the semiconductor integrated circuit according to the embodiment 2.

FIG. 5 is a circuit diagram illustrating an example of a configuration of the semiconductor integrated circuit according to the embodiment 2. In FIG. 5, A11, A12 and A13 shown in FIG. 4 are correspondingly represented. Reference symbols P101–P113 denote Pch transistors, N101–N117 denote Nch transistors, and I101–I104 denote inverters. D1 denotes an input data signal having a low transition probability. D2 denotes an input data signal having a high transition probability. SEL denotes an input data signal selection signal. CK denotes a clock signal. Q and NQ denote output data signals. C101 and C102 denote the precharge nodes. C103 denotes a data retaining node. S101 and S102 denote the feedback signals.

The semiconductor integrated circuit according to the embodiment 2 comprises:

the latch circuit A11 inputting therein the input data signals D1 and D2, input data signal selection signal SEL, clock signal CK, and feedback signals S101 and S102 and outputting the output data signal NQ;

the retaining circuit A12 retaining the output data signal NQ;

the feedback circuit A13 inputting therein the input data signals D1, input data signal selection signal SEL, and output data signal NQ, the feedback circuit A13 controlling the feedback signals S101 and S102 based on the logic combinations of the input data signal D1 and output data signal NQ when the input data signal selection signal SEL selects the input data signal D1, the feedback circuit A13 always outputting a constant value as the feedback signals S101 and S102 when the input data signal selection signal SEL selects the input data signal D2, characterized in that an internal operation of the latch circuit A11 is turned on/off by means of the feedback signals S101 and S102 when the input data signal selection signal SEL selects the input data signal S01, and the internal operation of the latch circuit A11 is constantly activated when the input data signal selection signal SEL selects the input data signal D2.

The operation according to the foregoing configuration is as follows. When the input data signal selection signal SEL selects the input data signal D1, the same function as in the embodiment 1 is exerted. More specifically, when the logic combinations of the input data signal D1 and output data signal NQ are not different before and after the clock signal CK is asserted, the feedback circuit A12 generates the feedback signals S101 and S102 serving to turn off the internal operation of the latch circuit A11 based on the logic combination. The latch circuit A11 accordingly halts the internal operation thereof based on the feedback signals S101 and S102, though the clocks signal CK supplied to the latch circuit A11 is not halted. An important factor in the embodiment 2 is that the internal operation of the latch circuit A11 is not halted without halting the clock signal CK. This enables the power consumption to be reduced. Next, when the logic combinations of the input data signal D1 and output data signal NQ are different before and after the clock signal CK is asserted, the feedback signals S101 and S102 from the feedback circuit A13 assert the internal operation of the latch circuit A11, in response to which the latch circuit A11 restarts its internal operation, leading the fluctuation of the input data signal into the fluctuation of the output data signal. At that time, the clock signal CK is being continuously oscillated, thereby achieving the setup with a better responsiveness and the operation at a higher speed. Thus, the low power consumption and high-speed operation, which were so far regarded as incompatible, can be simultaneously achieved. When the input data signal selection signal SEL selects the input data signal D2, the same operation as in a general dynamic-type semiconductor integrated circuit is obtained, in which the high-speed operation is guaranteed.

For the input data signal D1 is set a signal having the low transition probability, and for the input data signal D2 is set a signal having the high transition probability. In the case of a logic circuit comprised of a group of flip-flops, for example, an input data signal in normal operation corresponds to the input data signal D1, and an input data signal in a test operation as a scan chain corresponds to the input data signal D2.

The latch circuit A11 of the semiconductor integrated circuit according to the embodiment 2 comprises a dynamic circuit a11 and a NAND-type dynamic circuit a12. The dynamic circuit a11 is configured in the following manner. In the case in which the input data signal selection signal SEL selects the input data signal D1, the input data signal D1 and the feedback signal S101 outputted so as to have an inverted polarity relative to the input data signal D1 based on the output data signal NQ is inputted. The precharge node C101 is charged during the period from the fall to rise of the clock signal CK (when the clock signal becomes the "L" level). The charge is discharged from the precharge node C101 during the period from the rise to fall of the clock signal CK (when the clock signal becomes the "H" level) when the input data signal D1 and feedback signal S101 are both at the "H" level. The charge of the precharge node C101 is retained when one of the input data signal D1 and feedback signal S101 is at the "L" level. Further, in the case in which the input data signal selection signal SEL selects the input data signal D2, the charge of the precharge node C101 is discharged when the input data signal D2 is at the "H" level, and the charge of the precharge node C101 is retained when the input data signal D2 is at the "L" level.

The NAND-type dynamic circuit a12 is configured in the following manner. In the case in which the input data signal selection signal SEL selects the input data signal D1, the input data signal D1 and the feedback signal S102 as a logical sum of a signal, which is outputted so as to have a same polarity as the input data signal D1 based on the precharge node C101 and output data signal NQ is inputted. The precharge node C102 is charged during the period from the fall to rise of the clock signal CK (when the clock signal becomes the "L" level). The charge is discharged from the precharge node C102 during the period from the rise to fall of the clock signal CK (when the clock signal becomes the "H" level) when the precharge node C101 and feedback signal S102 are both at the "H" level. The charge of the precharge node C102 is retained when one of the precharge node C101 and feedback signal S102 is at the "L" level. Further, in the case in which the input data signal selection signal SEL selects the input data signal D2, the charge of the precharge node C102 is discharged when the input data signal selection signal SEL is at the "H" level and the precharge node C101 is at the "H" level, and the charge of the precharge node C102 is retained when the precharge node C101 is at the "L" level.

The latch circuit A11 comprises a plurality of Pch transistors P101–P107 and a plurality of Nch transistors N101–N107, N117 and N118 and a single inverter I101. More specifically, the latch circuit comprises:

the Pch transistor P101, wherein a gate is connected to the clocks signal CK, a source is connected to a power supply, and a drain is connected to the precharge node C101;

the Nch transistor N101, wherein a gate is connected to the clock signal CK and a source is grounded;

the Nch transistor N102, wherein a gate is connected to the input data signal D1 and a drain is connected to the precharge node C101;

the Nch transistor N103, wherein a gate is connected to the feedback signal S101, a drain is connected to a source of the Nch transistor N102, and a source is connected to a drain of the Nch transistor N101;

the Pch transistor P102, wherein a gate is connected to the clock signal CK, a source is connected to the power supply, and a drain is connected to the precharge node C102;

the Nch transistor N104, wherein a gate is connected to the precharge node C101 and a drain is connected to the precharge node C102;

the Nch transistor N105, wherein a gate is connected to the feedback signal S102, a drain is connected to a source of the Nch transistor N104, and a source is connected to the drain of the Nch transistor N101;

the inverter I101, wherein an input terminal is connected to the precharge node C102;

the Pch transistor P103, wherein a gate is connected to an output terminal of the inverter I101 and a source is connected to the power supply;

the Pch transistor P104, wherein a gate is connected to the precharge node C101 and a source is connected to a drain of the Pch transistor P103;

the Nch transistor P106, wherein a gate is connected to the precharge node C101, a source is grounded, and a drain is connected to a drain of the Pch transistor P104;

the Pch transistor P105, wherein a gate is connected to the precharge node C102, a source is connected to the power supply, and a drain is connected to the output data signal NQ;

the Nch transistor N107, wherein a gate is connected to the drain of the Nch transistor N106, a source is grounded, and a drain is connected to the output data signal NQ;

the Pch transistor P106, wherein a gate is connected to the output terminal of the inverter I101, a source is connected to the power supply, and a drain is connected the precharge node C102;

the Pch transistor P107, wherein a gate is connected to the precharge node C102, a source is connected to the power supply, and a drain is connected to the precharge node C101;

the Nch transistor N117, wherein a gate is connected to the input data signal D2 and a drain is connected to the precharge node C101; and the Nch transistor N118, wherein a gate is connected to the input data signal selection signal SEL, a drain is connected to a source of the Nch transistor N117, and a source is connected to the drain of the Nch transistor N101.

The dynamic circuit all comprises a combination of an NAND-type dynamic circuit including the Pch transistor P101, Nch transistor N102, Nch transistor N103, and Nch transistor N101, which are serially connected, and an NAND-type circuit including the Pch transistor P101, Nch transistor N117, Nch transistor N118, and Nch transistor N101, which are serially connected. The NAND-type dynamic circuit a12 comprises the Pch transistor P102, Nch transistor N104, Nch transistor N105, and Nch transistor N101, which are serially connected.

The feedback circuit A13 of the semiconductor integrated circuit according to the embodiment 2 comprises:

the Pch transistor P108, wherein a gate is connected to the output data signal NQ and a source is connected to a power supply;

the Pch transistor P110, wherein a gate is connected to the input data signal D1, a drain is connected to the feedback signal S102, and a source is connected to a drain of the Pch transistor P108;

the Nch transistor N110, wherein a gate is connected to the input data signal D1 and a drain is connected to the feedback signal S102;

the Nch transistor N111, wherein a gate is connected to the output data signal NQ, a drain is connected to the feedback signal S102, and a source is connected to a source of the Nch transistor N110;

the Pch transistor P111, wherein a gate is connected to the input data signal selection signal SEL and a source is connected to the power supply;

the Nch transistor N112, wherein a gate is connected to the input data signal selection signal SEL, a source is grounded, and a drain is connected to a drain of the Pch transistor P111;

the Nch transistor N113, wherein a gate is connected to the drain of the Nch transistor N112, a source is grounded, and a drain is connected to the source of the Nch transistor N110;

the Pch transistor P112, wherein a gate is connected to the drain of the transistor N112, a source is connected to the power supply, and a drain is connected to the feedback signal S102;

the Pch transistor P113, wherein a gate is connected to the data retaining node C103, a source is connected to the drain of the Pch transistor P111, and a drain is connected to the feedback signal S101;

the Nch transistor N114, wherein a gate is connected to the input data signal selection signal SEL, a drain is connected to the feedback signal S101, and a source is grounded; and the Nch transistor N115, wherein a gate is connected to the data retaining node C103, a drain is connected to the feedback signal S101, and a source is grounded.

When the discharge operation with respect to the precharge node C101 in its discharge path and the discharge operation with respect to the precharge node C102 in its discharge path race with each other in the foregoing configuration, errors are possibly generated. In order to prevent the racing, the charge of the precharge node C101 is released earlier, and the charge of the precharge node C102 is discharged later.

Hereinafter, the improvement is described.

In the foregoing configuration, it is preferable for the latch circuit A11 to be configured in the manner that, referring to a spatial distance in terms of physical layout, a distance between the Nch transistor N101 and Nch transistor N103 is set to be shorter than a distance between the Nch transistor N101 and Nch transistor N105. The operation according to the foregoing configuration is as follows. The smaller the spatial distance is, the easier the operation is, thereby achieving a better responsiveness. Therefore, the discharge is implemented earlier in the discharge path of the precharge node C101, where the Nch transistor N103 having the shorter distance is present, and the operation can be thereby more stable.

In the foregoing configuration, it is preferable for the latch circuit A11 to be configured in the manner that, referring to the threshold voltages of the MOS transistors, the threshold voltages of the Nch transistor N102 and Nch transistor N103 are set to be lower than the threshold voltages of the Nch transistor N104 and Nch transistor N105. The operation according to the foregoing configuration is as follows. The lower the threshold voltage is, the easier the operation is, thereby achieving a better responsiveness. Therefore, the discharge is implemented earlier in the discharge path of the precharge node C101, where the Nch transistors N102 and N103 having the lower threshold voltages are present, and the operation can be thereby more stable.

Figure 6:
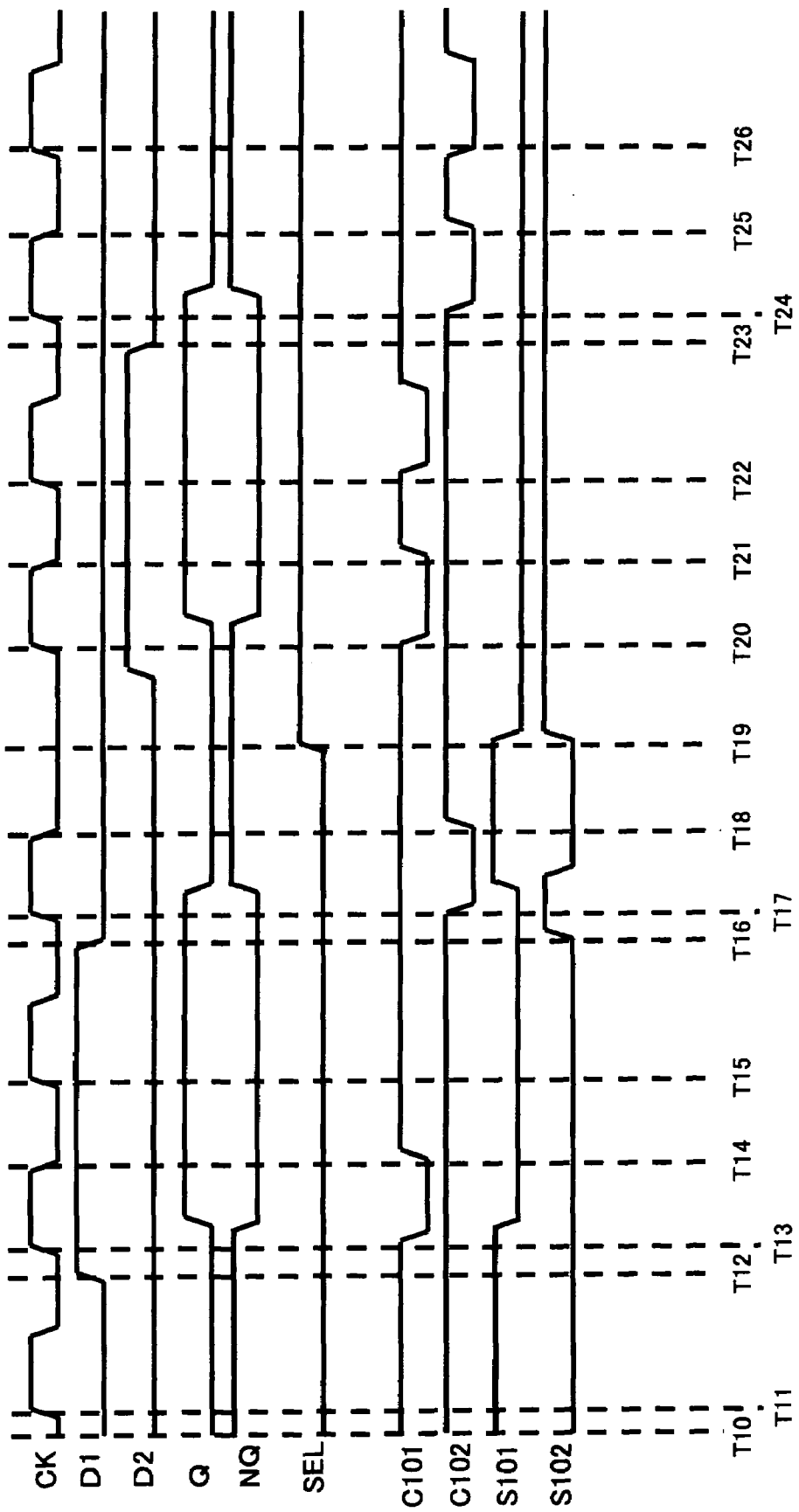
FIG. 6 is a waveform chart illustrating an operation of the semiconductor integrated circuit according to the embodiment 2.

FIG. 6 is a waveform chart illustrating the operation of the semiconductor integrated circuit according to the configuration of FIG. 5.

The input data signal selection signal SEL is at the "L" level from time T10 through time T18, therefore the Nch transistor N118 maintains its OFF state. More specifically, because of the input data signal selection signal SEL at the "L" level, the Pch transistor P111 is in the ON state, while the Nch transistors N112 and N114 are in the OFF state. Further, because the output data signal Q is at the "L" level and the data retaining node C103 of the data retaining circuit A12 is also at the "L" level, the Pch transistor P113 is in the ON state, while the Nch transistor N115 is in the OFF state. Because of this, the feedback signal S101 with respect to the gate of the Nch transistor N103 in the NAND-type dynamic circuit a12 is at the "H" level, and the Nch transistor N103 is in the ON state. In consequence of the above-mentioned, the operation during the period from the time T10 through the time T18 is substantially identical to the operation in the embodiment 1, as shown in the waveform chart of FIG. 5.

The state at the time T18 is as follows. The clock signal CK is at the "L" level and to be precharged during the period. In the latch circuit A11, the precharge node C101 and precharge node C102 are at the "H" level. The output data signal Q is at the "L" level, and the output data signal NQ is at the "H" level. The data retaining node C103 of the data retaining circuit A12 is at the "L" level. The Pch transistors P101, P102, P106 and P103 are in the ON state. The Pch transistors P107, P105 and P104 are in the OFF state. The Nch transistors N103, N104 and N106 are in the ON state. The Nch transistors N101, N102, N105, N107, N117 and N118 are in the OFF state. Meanwhile, in the feedback circuit A13, the Pch transistors P110, P111 and P113 are in the ON state. The Pch transistors P108 and P112 are in the OFF state. The Nch transistors N111 and N113 are in the ON state. The Nch transistors N110, N112, N114 and N115 are in the OFF state.

1) At time T19, it is assumed that the input data signal selection signal SEL rises to the "H" level. The Pch transistor P111 is then lead to OFF, Nch transistor N112 to ON, and Nch transistor N114 also to ON. The feedback signal S101 is inverted from the "H" level to the "L" level. As a result, the Nch transistor N103 is inverted to the OFF state. Further, because the Pch transistor P111 is OFF and the Nch transistor N112 is ON, the Pch transistor P112 is ON and the Nch transistor N113 is OFF. The feedback signal S102 is inverted from the "L" level to the "H" level. As a result, the Nch transistor N105 is inverted to the ON state. However, the clock signal CK is at the "L" level, and the Nch transistor N101 is in the OFF state, therefore the precharge node C101 and precharge node C102 maintain their "H" level.

2) It is assumed that the clock signal CK rises to the "H" level at time T20. The Nch transistor N101 is accordingly inverted to the ON state. At that time, the Nch transistor N118 is already in the ON state. The input data signal D2 is inverted from the "L" level to the "H" level immediately before the time T20, and the Nch transistor N117 is accordingly in the ON state. Therefore, the precharge node C101 is discharged, resulting in the "L" level. In accordance with this, the Nch transistor N104 is inverted to the OFF state, and the precharge node C102 is not discharged. The precharge node C102 therefore retains its charge maintaining its "H" level.

The inversion of the precharge node C101 to the "L" level results in the inversion of the Pch transistor P104 to the ON state and also the inversion of the Nch transistor N106 to the OFF state. Because of the Pch transistor P103 in the ON state, the Nch transistor N107 is inverted to the ON state. As a result, the output data signal NQ is inverted to the "L" level, while the output data signal Q is inverted to the "H" level. The data retaining node C103 is inverted to the "H" level.

3) When the clock signal CK falls at time T21, the Pch transistor P101 is inverted to be in the ON state, and the precharge node C101 is charged.

4) When the clock signal CK rises at time T22, the Nch transistor N101 is inverted to be in the ON state, and the discharge is implemented in a path involving the Nch transistors N117, N118 and N101. The precharge node C101 is thereby inverted to the "L" level.

Thereafter, the clock signal CK falls again by time T23, and the precharge node C101 is thereby charged.

5) At the time T23, the input data signal D2 is inverted from the "H" level to the "L" level, and the Nch transistor N117 is inverted to the OFF state.

6) It is assumed that the clocks signal CK rises to the "H" level at time T24. The Pch transistors P101 and P102 are inverted to the OFF state. At that time, the feedback signal S101 is at the "L" level, and the Nch transistor N103 is in the OFF state. Meanwhile, the feedback signal S102 is at the "H" level, and the Nch transistor N105 is in the ON state. The precharge node C101 is at the "H" level, therefore the Nch transistor N104 is in the ON state. Accordingly, when the Pch transistor P102 is inverted to be in the OFF state, the precharge node C102 is connected to the ground via the Nch transistors N104, N105 and N101 to thereby discharge. At that time, the output of the inverter I01 is inverted to the "H" level, and the Pch transistor P106 is inverted to the OFF state. As a result, the precharge node C102 is inverted from the "H" level to the "L" level.

7) It is assumed that the clock signal CK falls to the "L" level at time T25. The Pch transistor P102 is inverted to the ON state, while the Nch transistor N101 is inverted to the OFF state. The precharge node C012 is thereby charged, and inverted to the "H" level.

As described, when the input data signal selection signal SEL is at the "H" level, the precharge is implemented by means of the fall of the clock signal CK, and the discharge is implemented by means of the rise of the clock signal CK. The input data signal D2 is then fetched. The discharge is implemented in the dynamic circuit all when the input data signal D2 is at the "H" level, and in the NAND-type dynamic circuit a12 when the input data signal D2 is at the "L" level.

The features of the embodiment 2 are mentioned below.

In the case in which the input data signal D1 having the low transition probability is selected, the internal operation of the latch circuit A11 is halted by means of the logics of the input data signal D1 and output data signal Q when the input data signal D1 and output data signal Q are in the same state to thereby reduce the power consumption and maintain the high-speed operation of the dynamic circuit itself as in the embodiment 1. When the input data signal D2 having the high transition probability is selected, the internal operation of the latch circuit A11 remains active enabling the high-speed operation of the dynamic circuit itself.

Embodiment 3

Figure 7:
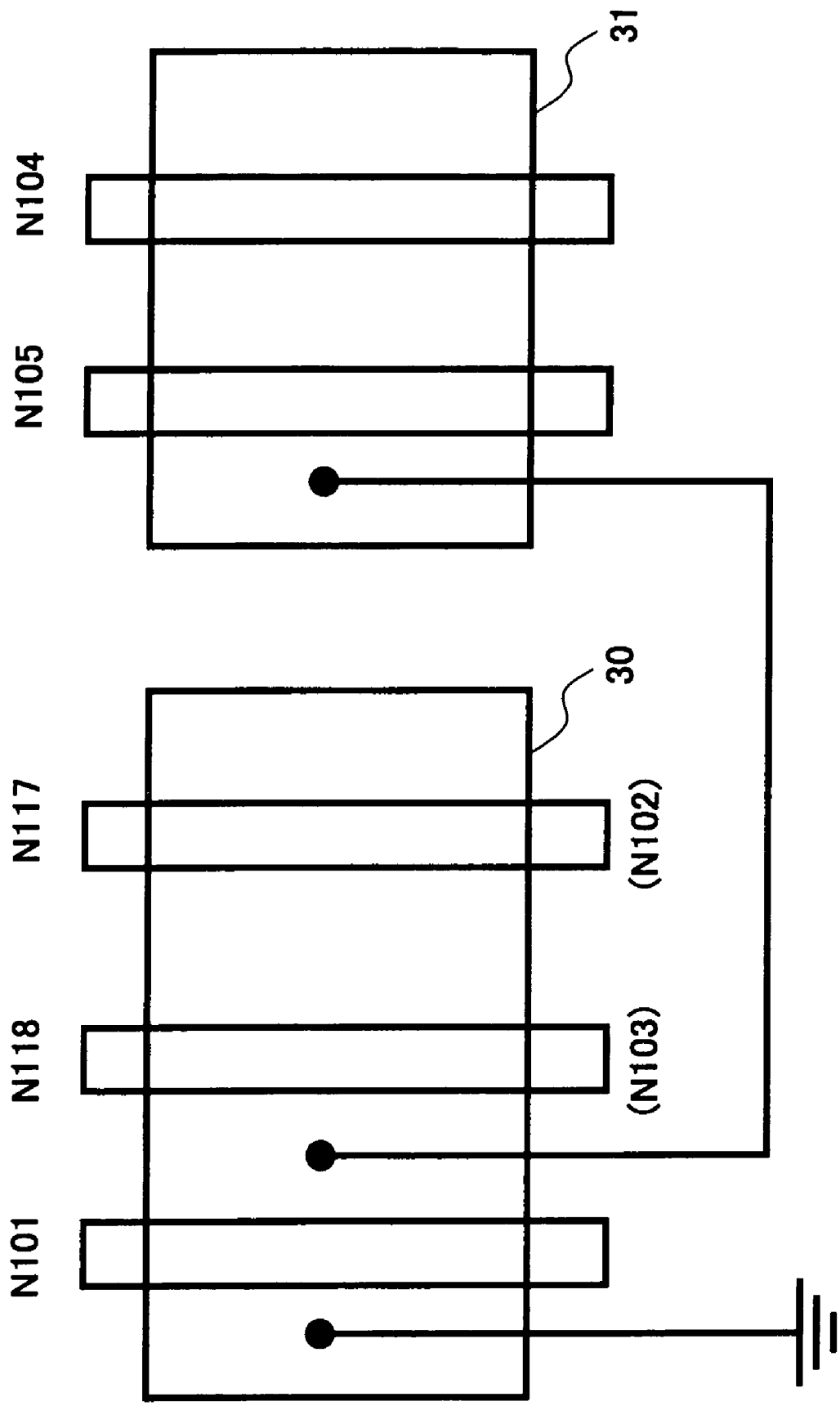
FIG. 7 is a plane view partially illustrating an example of a semiconductor integrated circuit according to an embodiment 3 of the present invention

FIG. 7 is a plane view partially illustrating an example of a semiconductor integrated circuit according to an embodiment 3 of the present invention. The embodiment 3 offers a technology for preventing a racing between the Nch transistors N104, N105 and the Nch transistors N117, N118 in the latch circuit A11 shown in FIG. 5. The charge of the precharge node C101 is discharged earlier, while the precharge node C102 is discharged later.

FIG. 7 shows a circuit block 30 comprising the Nch transistors N101, N117 and N118 of FIG. 5, and a circuit block 31 comprising the Nch transistors N104 and N105 of FIG. 5, which are formed on the semiconductor substrate.

The circuit block 30 is formed from diffusion regions constituting the source and drain of the Nch transistor N101 and gate electrodes thereof, diffusion regions constituting the source and drain of the Nch transistor N118 and gate electrodes thereof, and diffusion regions constituting the source and drain of the Nch transistor N117 and gate electrodes thereof, which are sequentially disposed in a transverse direction. The diffusion region constituting the source of the Nch transistor N118 is in common with the diffusion region constituting the drain of the Nch transistor N101. The diffusion region constituting the source of the Nch transistor N117 is in common with the diffusion region constituting the drain of the Nch transistor N118.

The circuit block 31 is formed from diffusion regions constituting the source and drain of the Nch transistor N105 and gate electrodes thereof and diffusion regions constituting the source and drain of the Nch transistor N104 and gate electrodes thereof, which are sequentially disposed in the transverse direction. The diffusion region constituting the source of the Nch transistor N104 is in common with the diffusion region constituting the drain of the Nch transistor N105.

The source diffusion region of the Nch transistor N101 is connected to the ground potential. Further, the drain of the Nch transistor N101 and the source of the Nch transistor N118 are connected to the source of the Nch transistor N105.

In the embodiment 2, the circuit blocks 30 and 31 are adjacently disposed in the transverse direction, however may be adjacently disposed lengthwise.

The operation of the semiconductor integrated circuit according to the embodiment 3 having the foregoing configuration is described below.

For example, before the clock signal CK rises at the time T22 in FIG. 6, the Nch transistor N118 is in the ON state because the input data signal selection signal SEL is at the "H" level. The Nch transistor N117 is in the ON state because the input data signal D2 is at the "H" level. The Nch transistor N105 is in the ON state because the feedback signal S102 is at the "H" level. The Nch transistor N104 is in the ON state because the precharge node C101 is at the "H" level.

Thereafter, as soon as the clock signal CK rises, the level of the precharge node C102 descends to the "L" level direction in compliance with the capacities of the Nch transistors N104 and N105 until the precharge node C101 changes to the "L" level.

For that reason, the diffusion region constituting the drain of the Nch transistor N101 and the diffusion region constituting the source of the Nch transistor N118 are disposed closer to the diffusion region constituting the source of the Nch transistor N105. In that manner, the charge of the precharge node C101 is discharged earlier, and the charge of the precharge node C102 is discharged later so that the Nch transistors N104, N105 and the Nch transistors N117, N118 are prevented from racing with each other.

Hereinafter is described another method of discharging the precharge node C101 earlier and discharging the precharge node C102 later.

The threshold voltages of the Nch transistors N117 and N118 are set to be lower than the threshold voltages of the Nch transistors N104 and N105 so that the charge of the precharge node C101 is discharged earlier, and the charge of the precharge node C102 is discharged later. In that manner, the Nch transistors N104 nad N105 and the Nch transistors N117 and N118 are prevented from racing with each other.

Further, when STI (sharow Trench isolation) formed between the adjacent circuit blocks deteriorates transistor characteristics, the diffusion region constituting the source of the Nch transistor N103 and diffusion region constituting the drain of the Nch transistor N104 are formed on the STI side so that the transistor characteristics of the drains of the Nch transistors N103 and N104 are more deteriorated (lower current capacity, increased threshold voltage, or the like) than the transistor characteristics of the Nch transistors N101, N117 and N118. Then, the precharge node C101 is discharged earlier, and the precharge node C102 is discharged later so that the Nch transistors N104, N105 and the Nch transistors N117, N118 are prevented from racing with each other.

Further, in the embodiment 3, the STI sepraration is present outside the Nch transistor N117, which possibly causes the deterioration of the transistor characteristic of the Nch transistor N117. As a possible configuration, as shown in FIG. 8, a dummy transistor N150 having a dummy source diffusion region and a dummy gate electrode can be formed outside the Nch transistor N117, and connected to the ground potential in the same manner to thereby further control the deterioration of the transistor characteristic of the Nch transistor N117.

The embodiment 3 was exemplified and described based on the fact that the transistor characteristics mostly deteriorate due to the STI formed between the adjacent circuit blocks.

However, from the aspect of a possible situation in the future, where the STI formed between the adjacent circuit blocks can improve the transistor characteristics, in the present embodiment, the source diffusion region of the Nch transistor N117 and the drain diffusion region of the Nch transistor N118 are disposed on the STI side to thereby improve the transistor characteristics of the Nch transistors N117 and N118. Then, the dummy source diffusion region and dummy gate electrode are formed outside the source diffusion region of the Nch transistor N103 and the drain diffusion region of the Nch transistor N104, and connected to the ground potential in the same manner, to thereby control the improvement of the transistor characteristics of the Nch transistors N103 and N104.

In FIGS. 7 and 8, N117 may be replaced by N102, and N118 may be replaced by N103 to understand the configuration.

Embodiment 4

Figure 9:
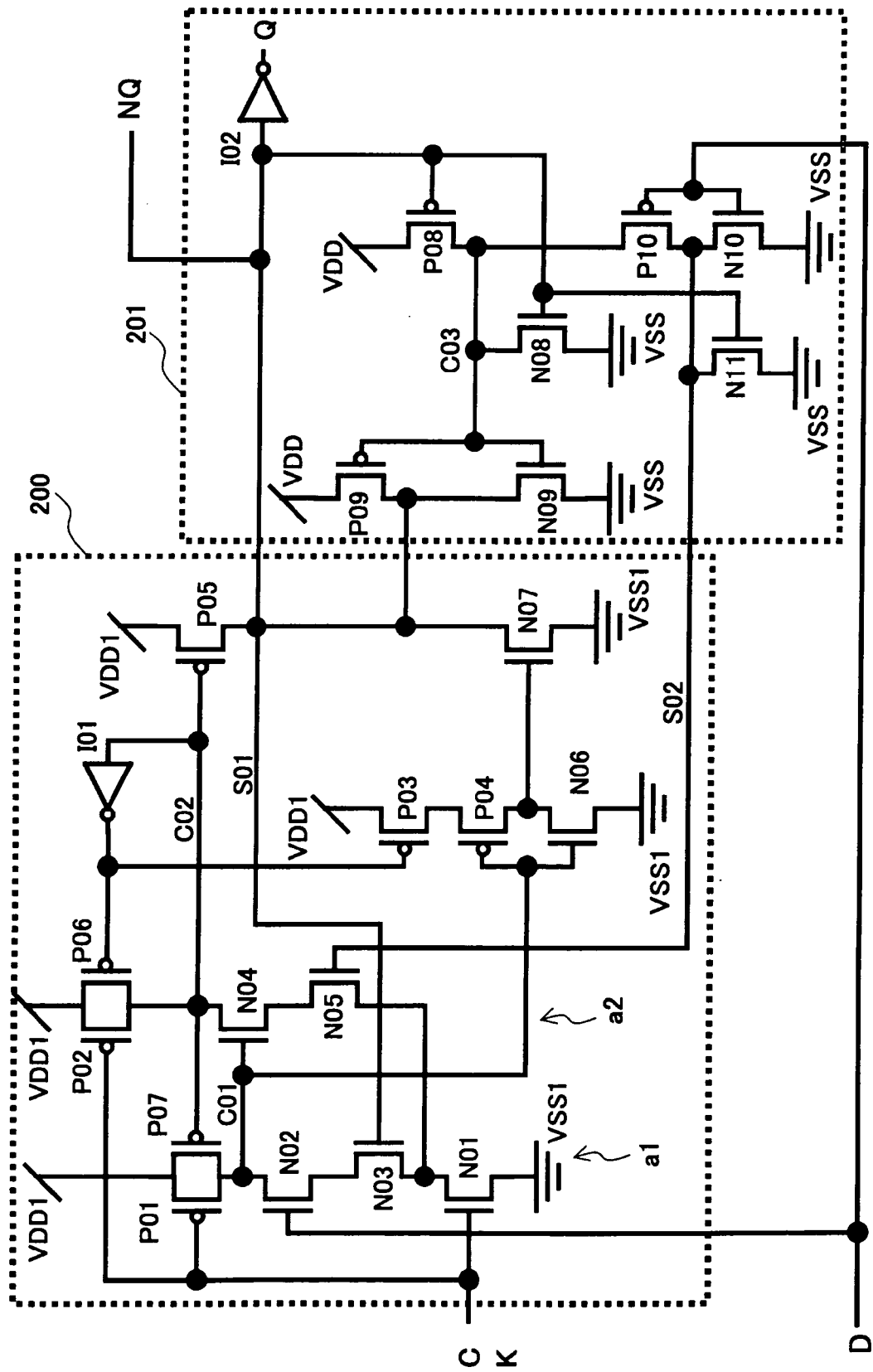
FIG. 9 is a circuit diagram illustrating an example of a specific configuration of a semiconductor integrated circuit according to an embodiment 4 of the present invention.
Figure 10:
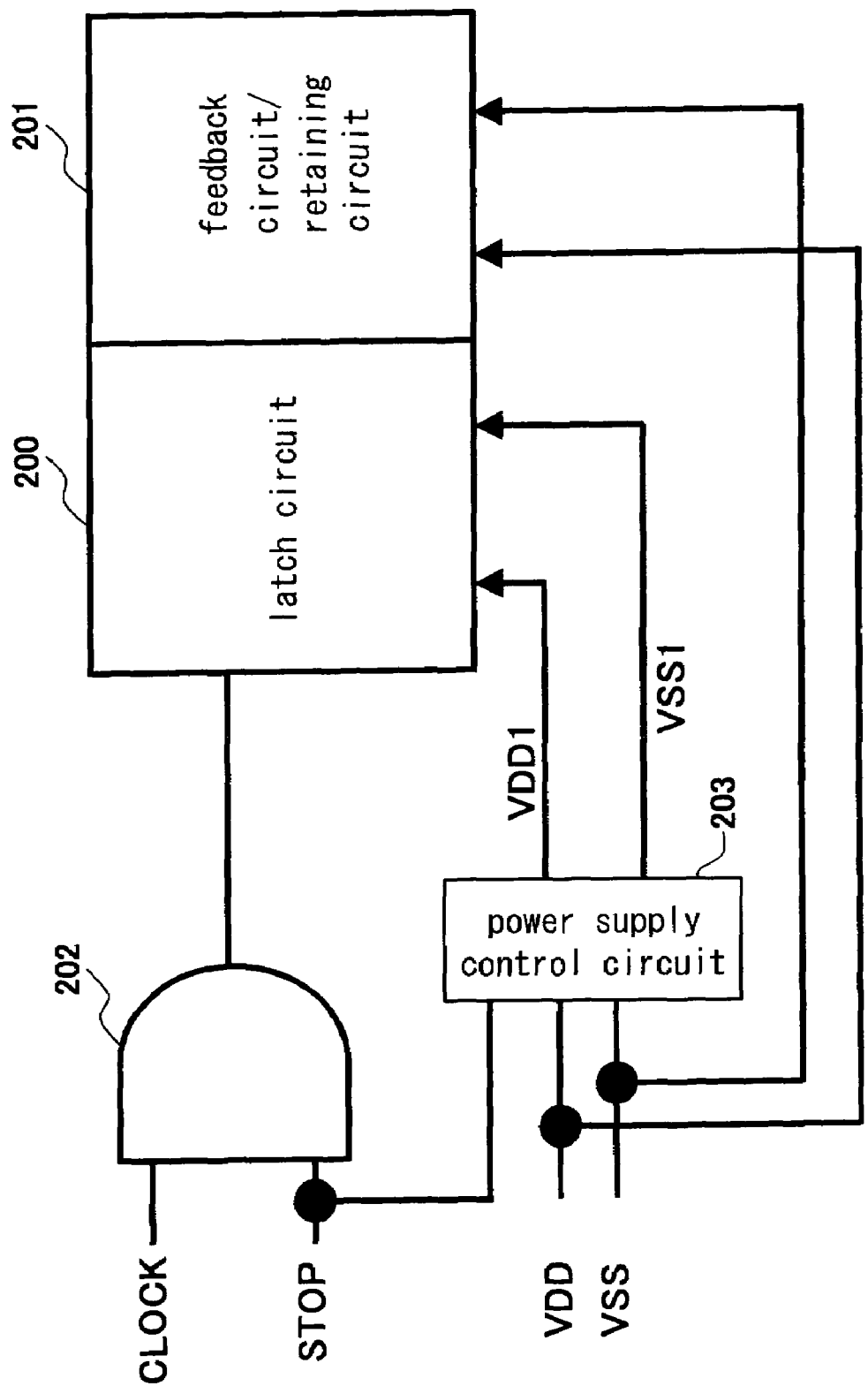
FIG. 10 is a block diagram illustrating a configuration of a peripheral circuit of a power supply control circuit in the semiconductor integrated circuit according to the embodiment 4.

FIGS. 9 and 10 are views each illustrating a configuration of a semiconductor integrated circuit according to an embodiment 4 of the present invention. In FIG. 9, reference symbols P01–P10 denote P-type MOS transistors. N01–N11 denote N-type MOS transistors. I01 and I02 denote inverters.

A reference numeral 200 denotes a latch circuit. In the latch circuit 200, the Pch transistors P01–P07 and inverter I01 are connected to a power supply VDD1, and the Nch transistor N01–N07 and inverter I01 are connected to a ground potential VSS1. A reference numeral 201 denotes a feedback circuit/retaining circuit. In the feedback circuit/retaining circuit 201, the Pch transistors P08–P10 and inverter I02 are connected to a power supply VDD, and the Nch transistors N08–N11 and inverter I02 are connected to a ground potential VSS.

FIG. 10 is a configuration diagram illustrating the supply of the power supply and ground potential to the feedback circuit/retaining circuit 201. CLOCK denotes a clock, and STOP denotes a clock feedback signal. The clock feedback signal STOP outputs the "H" level in normal operation, while outputting the "L" level when the clock is halted.

A reference numeral 202 denotes an AND circuit. The AND circuit 202 supplies the latch circuit 200 with the clock in normal operation, while supplying "L" level when the clock is halted.

The configuration shows an example in which the "L" level is supplied when the clock is halted, however there is no problem in the circuit operation if the "H" level is supplied when the clock is halted.

A reference numeral 203 denotes a power supply control circuit. The power supply control circuit 203 inputs therein the power supply VDD and ground potential VSS.

The power supply control circuit 203 outputs the power supply VDD1 of the same level as the power supply VDD and the ground potential VSS1 of the same level as the ground potential VSS to the latch circuit 200 when the clock feedback signal STOP is normally actuated. The power supply control circuit 203 outputs the power supply VDD1 of the same level as the power supply VDD and the ground potential VSS1 of a potential higher than the ground potential VSS to the latch circuit 200 when the clock feedback signal STOP halts the clock.

The latch circuit 203 is controlled in the foregoing manner so as to increase the potential level of the ground potential VSS1 when the clock is halted, thereby reducing a leak current from the latch circuit 200.

Because the power supply control circuit 203 is controlled in the described manner, the power supply can be turned off when the clock is halted to thereby reduce the leak current from the latch circuit 200 while keeping information retained in the retaining circuit 201.

Embodiment 5

Figure 11:
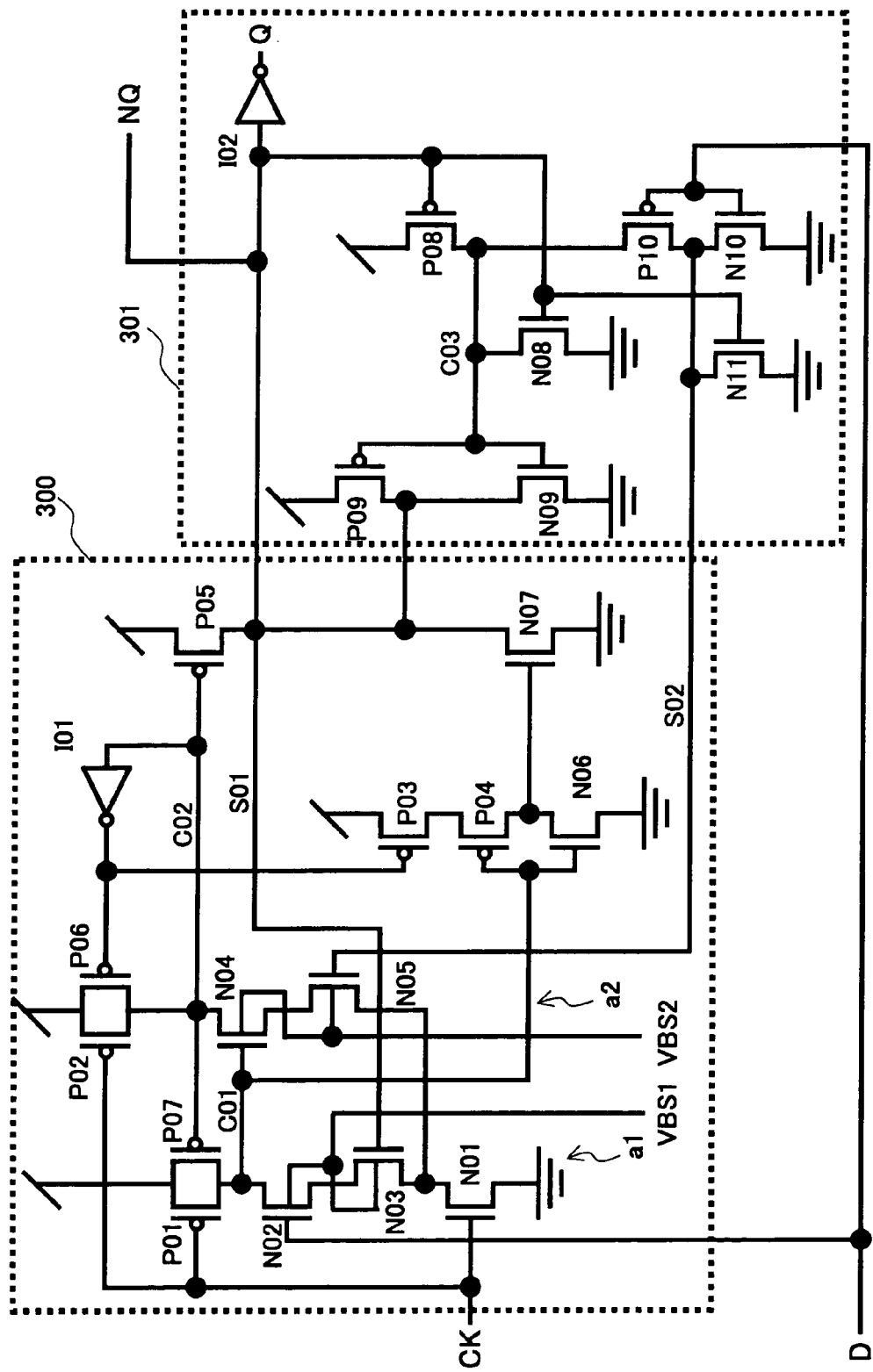
FIG. 11 is a circuit diagram illustrating an example of a specific configuration of a semiconductor integrated circuit according to an embodiment 5 of the present invention.

FIGS. 11 and 12 are views each illustrating a configuration of a semiconductor integrated circuit according to an embodiment 5 of the present invention.

In FIG. 11, reference symbols P01–P10 denote P-type MOS transistors, and reference symbols N01–N11 denotes N-type MOS transistors. Reference symbols I01 and I02 respectively denote an inverter.

A reference numeral 300 denotes a latch circuit. In the latch circuit 300, substrate potentials of the Nch transistors N02 and N03 are connected to a VBS1, and substrate potentials of the Nch transistors N04 and N05 are connected to a VBS2.

FIG. 12 is a configuration diagram illustrating the supply of a substrate potential to the latch circuit 300.

To a substrate potential control circuit 301 are inputted the feedback signal S01 and feedback signal S02 from the latch circuit 300, and also a power supply VDD and ground potential VSS. Further, from the substrate potential control circuit 301 are outputted a substrate potential VBS1 and a substrate potential VBS2 to the latch circuit 300. The substrate potential VBS1 is supplied to the Nch transistors N02 and N03 of a NAND-type dynamic circuit a1 in the latch circuit 300. The substrate potential VBS2 is supplied to the Nch transistors N04 and N05 of a NAND-type dynamic circuit a2 in the latch circuit 300.

The substrate potential VBS1 outputs a potential lower than the ground potential when the feedback signal S01 is at the "L" level, and outputs a potential higher than the ground potential when the feedback signal S01 is at the "H" level. The substrate potential VBS2 outputs a potential lower than the ground potential when the feedback signal S02 is at the "L" level, and outputs a potential higher than the ground potential when the feedback signal S02 is at the "H" level The substrate potential control circuit 301 is thus controlled so that, when the feedback signal S01 is at the "H" level, and the Nch transistors N02 and N03 are operated, the substrate potential is controlled in a forward bias direction, and the threshold potentials of the Nch transistors N02 and N03 are lowered to thereby enable a high-speed operation.

On the contrary, when the feedback signal S01 is at the "L" level, and the Nch transistors N02 and N03 come to a halt, the substrate potential is controlled in a back bias direction so that the threshold potentials of the Nch transistors N02 and N03 are raised to thereby reduce the leak current.

When the feedback signal S02 is at the "H" level, and the Nch transistors N04 and N05 are operated, the substrate potential is controlled in the forward bias direction so that the threshold potentials of the Nch transistors N04 and N05 are lowered to thereby enable the high-speed operation.

On the contrary, when the feedback signal S02 is at the "L" level, and the Nch transistors N04 and N05 come to a halt, the substrate potential is controlled in the back bias direction so that the threshold potentials of the Nch transistors N04 and N05 are raised to thereby reduce the leak current Embodiment 6

Figure 15:
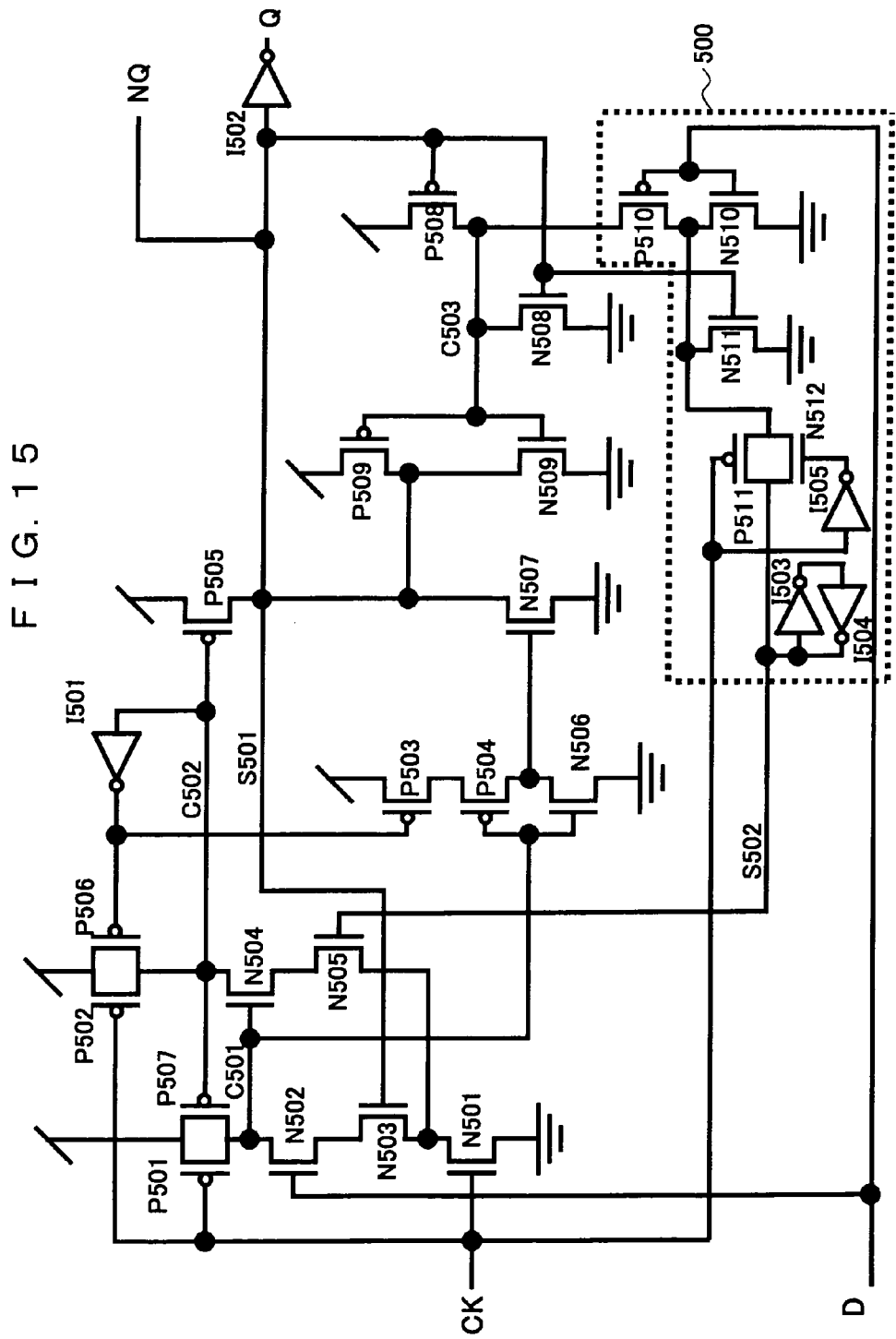
FIG. 15 is a circuit diagram illustrating an example of a specific configuration of a semiconductor integrated circuit according to an embodiment 6 of the present invention.

FIG. 15 is a circuit diagram illustrating an example of a configuration of a semiconductor integrated circuit according to an embodiment 6 of the present invention. In FIG. 15, reference symbols P501–P511 denote Pch transistors, and N501–N512 denote Nch transistors. Reference symbols I501, I502, I503, I504 and I505 respectively denote a inverter. C501 and C502 denote precharge nodes and C503 denotes a data retaining node. S501 and S502 respectively denote a feedback signal. A reference numeral 500 denotes a feedback circuit. In FIG. 15, the configuration of FIG. 2 described in the embodiment 1 is further provided with a path gate circuit and a circuit for retaining an output of the path gate circuit.

Next, the operation of the semiconductor integrated circuit according to the embodiment 6 having the foregoing configuration is described below.

For example, in the case in which the input data signal D is at the "H" level, the output data signal Q is at the "H" level, the output data signal NQ is at the "L" level, and the clock signal CK is at the "L" level, the Pch transistor P508 is turned on, the Pch transistor P510 is turned off, the Nch transistor N511 is turned off, and the Nch transistor N510 is turned on. Further, because the clock signal CK is at the "L" level, the Nch transistor N512 is ON. Because the inverter I505 outputs the "H" level, the Pch transistor P511 is ON, and the feedback signal S502 is at the "L" level.

Next, when the clock signal rises to be at the "H" level, the Nch transistor N512 is OFF because of the clock signal CK at the "H" level, the Pch transistor P511 is OFF because the output level of the inverter I505 is "L", the Pch transistor P511 is OFF. The feedback signal S502 accordingly retains a previous value by means of the inverters I503 and I504.

The value of the feedback signal S502 is determined during the period when the clock signal CK is at the "L" level. Then, the Pch transistor P511 and Nch transistor N512 are turned off when the clock signal CK rises so that the value of the feedback signal S502 is retained without depending on the values of the input data signal D, output data signal Q and output data signal NQ to thereby reduce a hold time with respect to the input data signal D.

The embodiment 6 was described by means of the circuit configuration based on the embodiment 1. Further, the embodiments 2 through 5 can also achieve a corresponding effect by further providing, in their configurations, the path gate circuit and the circuit for retaining the output of the path gate circuit.

While the invention has been described and illustrated in detail, it is to be clearly understood that this is intended be way of illustration and example only and is not to be taken by way of limitation, the spirit and scope of this invention being limited only be the terms of the following claims.

What is claimed is:

1. A semiconductor integrated circuit comprising:
a latch circuit, the latch circuit inputting therein an input data signal, a clock signal, and a feedback signal and outputting an output data signal;
a retaining circuit, the retaining circuit retaining the output data signal; and
a feedback circuit, the feedback circuit inputting therein the input data signal and the output data signal to thereby generate the feedback signal based on logic combinations of the input data signal and output data signal, wherein
signal transmission inside the latch circuit is stopped by means of the feedback signal when the clock signal is supplied to the latch circuit.

2. A semiconductor integrated circuit as recited in claim 1, wherein
the latch circuit internally generates a first feedback signal based on data to be outputted as the output data signal, the input data signal and the output data signal are inputted in the feedback circuit,
the feedback circuit generates a second feedback signal as the feedback signal generated based on the output data signal and the input data signal, and
the signal transmission inside the latch circuit is controlled by means of both the first feedback signal and the second feedback signal.

3. A semiconductor integrated circuit as recited in claim 2, wherein
the latch circuit comprises a first NAND-type dynamic circuit and a second NAND-type dynamic circuit,
the first NAND-type dynamic circuit is configured such that,
the input data signal, the clock signal, and the first feedback signal are inputted therein, and
a first precharge node is charged when the clock signal becomes low, the charge of the first precharge node is discharged when the clock signal becomes high, and the input data signal and the first feedback signal are both at a "H" level, and the charge of the first precharge node is retained when at least one of the input data signal and the first feedback signal is at a "L" level,
the second NAND-type dynamic circuit is configured such that
the first precharge node, the clock signal, and the second feedback signal are inputted therein, and
a second precharge node is charged when the second precharge node is not charged, and the clock signal becomes low, the charge of the second precharge node is discharged when the second precharge node is charged, the clock signal becomes high, and the first precharge node and the second feedback signal are both at the "H" level, and the charge of the second precharge node is retained when at least one of the first precharge node and the second feedback signal is at the "L" level.

4. A semiconductor integrated circuit as claimed in claim 3, wherein the latch circuit comprises:
a first P-type MOS transistor, wherein a gate is connected to the clock signal, a source is connected to a power supply, and a drain is connected to the first precharge node;
a first N-type MOS transistor, wherein a gate is connected to the clock signal and a source is grounded;
a second N-type MOS transistor, wherein a gate is connected to the input data signal and a drain is connected to the first precharge node;
a third N-type MOS transistor, wherein a gate is connected to the first feedback signal, a drain is connected to a source of the second N-type MOS transistor, and a source is connected to a drain of the first N-type MOS transistor;
a second P-type MOS transistor, where in a gate is connected to the clock signal, a source is connected to the power supply and a drain is connected to the second precharge node;
a fourth N-type MOS transistor, wherein agate is connected to the first precharge node and a drain is connected to the second precharge node;
a fifth N-type MOS transistor, wherein a gate is connected to the second feedback signal, a drain is connected to a source of the fourth N-type MOS transistor, and a source is connected to the drain of the first N-type MOS transistor;
a first inverter, wherein an input terminal is connected to the second precharge node;
a third P-type MOS transistor, wherein a gate is connected to an output terminal of the first inverter and a source is connected to the power supply;

a fourth P-type MOS transistor, wherein agate is connected to the first precharge node and a source is connected to a drain of the third P-type MOS transistor;
a sixth N-type MOS transistor, wherein a gate is connected to the first precharge node, a source is grounded, and a drain is connected to a drain of the fourth P-type MOS transistor;
a fifth P-type MOS transistor, wherein a gate is connected to the second precharge node, a source is connected to the power supply, and a drain is connected to the first output data signal;
a seventh N-type MOS transistor, wherein a gate is connected to the drain of the sixth N-type MOS transistor, a source is grounded, and a drain is connected to the first output data signal;
a sixth P-type MOS transistor, wherein a gate is connected to the output terminal of the first inverter, a source is connected to the power supply, and a drain is connected to the second precharge node; and
a seventh P-type MOS transistor, wherein a gate is connected to the second precharge node, a source is connected to the power supply, and a drain is connected to the first precharge node.

5. A semiconductor integrated circuit as claimed in claim 4, wherein the latch circuit is configured such that the P-type MOS transistors are replaced by the N-type MOS transistors, the N-type MOS transistors are replaced by the P-type MOS transistors, the power supply is replaced by the ground, and the ground is replaced by the power supply when the first and second feedback signals are signals of an inversion logic.

6. A semiconductor integrated circuit as claimed in claim 4, wherein the retaining circuit comprises:
an eighth P-type MOS transistor, wherein a gate is connected to the output data signal and a source is connected to the power supply;
an eighth N-type MOS transistor, wherein a gate is connected to the output data signal, a source is grounded, and a drain is connected to a drain of the eighth P-type MOS transistor;
a ninth P-type MOS transistor, wherein a gate is connected to the drain of the eighth N-type MOS transistor, a source is connected to the power supply, and a drain is connected to the first output data signal and the first feedback signal; and
a ninth N-type MOS transistor, wherein a gate is connected to the drain of the eighth N-type MOS transistor, a source is grounded, and a drain is connected to the first output data signal and the first feedback signal.

7. A semiconductor integrated circuit as claimed in claim 4, wherein the feedback circuit comprises:
a tenth P-type MOS transistor, wherein a gate is connected to the input data signal, a drain is connected to the second feedback signal, and a source is connected to the drain of the eighth P-type MOS transistor;
a tenth N-type MOS transistor, wherein a gate is connected to the input data signal, a drain is connected to the second feedback signal, and a source is grounded; and
an 11th N-type MOS transistor, wherein a gate is connected to the output data signal, a drain is connected to the second feedback signal, and a source is grounded.

8. A semiconductor integrated circuit comprising:
a latch circuit, the latch circuit inputting therein a plurality of input data signals, an input data signal selection signal, a clock signal, and a feedback signal and outputting an output data signal;
a retaining circuit, the retaining circuit retaining the output data signal; and
a feedback circuit, the feedback circuit inputting therein the input data signals, the input data signal selection signal, and the output data signal to thereby generate the feedback signal based on logic combinations of the input data signal selected by the input data signal selection signal and the output data signal, wherein
signal transmission inside the latch circuit is stopped by means of the feedback signal in compliance with the input data signal selected by the input data signal selection signal when the clock signal is supplied to the latch circuit.

9. A semiconductor integrated circuit comprising:
a latch circuit, the latch circuit inputting therein a first input data signal, a second input data signal, an input data signal selection signal which indicates Whether the first input data signal or the second input data signal is effective, a clock signal, and a feedback signal, and outputting an output data signal;
a retaining circuit, the retaining circuit retaining the output data signal; and
a feedback circuit, the feedback circuit inputting therein the first input data signal, the input data signal selection signal, and the output data signal,
the feedback circuit always outputting a constant value as the feedback signal when the input data signal selection signal indicates the second input data signal is effective, wherein
signal transmission inside the latch circuit is stopped by means of the feedback signal when the input data signal selection signal indicates the first input data signal is effective, when the clock signal is supplied to the latch circuit and
the signal transmission inside the logic circuit is constantly activated when the input data signal selection signal indicates the second input data signal is effective.

10. A semiconductor integrated circuit as claimed in claim 9, wherein
the latch circuit comprises a dynamic circuit and an NAND-type dynamic circuit,
the dynamic circuit is configured such that
in the case in which the input data signal selection signal indicates that the first input data signal is effective,
a first feedback signal outputted so as to have an inverted polarity relative to the first input data signal based on the first input data signal and the output data signal is inputted therein,
a first precharge node is charged when the clock signal becomes low, the charge of the first precharge node is discharged when the clock signal becomes high, and when the first input data signal and the first feedback signal are both at a "H" level, the charge of the first precharge node is retained when one of the first input data signal and the first feedback signal is at a "L" level, and
in the case in which the input data signal selection signal indicates that the second input data signal is effective,
the charge of the first precharge node is discharged when the second input data signal is at the "H" level, and the charge of the first precharge node is retained when the second input data signal is at the "L" level,
the NAND-type dynamic circuit is configured such that
in the case in which the input data signal selection signal indicates the first input data signal is effective,
a second feedback signal as a logical sum of a signal, which is outputted so as to have a same polarity as the first input data signal based on the first precharge node and the output data signal, and the first input data signal is inputted, a second precharge node is charged when the clock signal becomes low, the charge of the second precharge node is discharged when the clock signal becomes high, and the first precharge node and the second feedback signal are both at the "H" level, and the charge of the second precharge node is retained when one of the first precharge node and the second feedback signal is at the "L" level, and in the case in which the input data signal selection signal indicates the second input data signal is effective, the charge of the second precharge node is discharged when the input data signal selection signal is at the "H" level and the first precharge node is at the "H" level, and the charge of the second precharge node is retained when the first precharge node is at the "L" level.

11. A semiconductor integrated circuit as claimed in claim 9, wherein the latch circuit comprises:

a first P-type MOS transistor, wherein a gate is connected to the clock signal, a source is connected to a power supply, and a drain is connected to the first precharge node;

a first N-type MOS transistor, wherein a gate is connected to the clock signal and a source is grounded;

a second N-type MOS transistor, wherein a gate is connected to the first input data signal and a drain is connected to the first precharge node;

a third N-type MOS transistor, wherein a gate is connected to the first feedback signal, a drain is connected to a source of the second N-type MOS transistor, and a source is connected to a drain of the first N-type MOS transistor;

a second P-type MOS transistor, wherein a gate is connected to the clock signal, a source is connected to the power supply, and a drain is connected to the second precharge node;

a fourth N-type MOS transistor, wherein a gate is connected to the first precharge node and a drain is connected to the second precharge node;

a fifth N-type MOS transistor, wherein a gate is connected to the second feedback signal, a drain is connected to a source of the fourth N-type MOS transistor, and a source is connected to the drain of the first N-type MOS transistor;

a first inverter, wherein an input terminal is connected to the second precharge node;

a third P-type MOS transistor, wherein a gate is connected to an output terminal of the first inverter and a source is connected to the power supply;

a fourth P-type MOS transistor, wherein a gate is connected to the first precharge node and a source is connected to a drain of the third P-type MOS transistor;

a sixth N-type MOS transistor, wherein a gate is connected to the first precharge node, a source is grounded, and a drain is connected to a drain of the fourth P-type MOS transistor;

a fifth P-type MOS transistor, wherein a gate is connected to the second precharge node, a source is connected to the power supply, and a drain is connected to the first output data signal;

a seventh N-type MOS transistor, wherein a gate is connected to the drain of the sixth N-type MOS transistor, a source is grounded, and a drain is connected to the first output data signal;

a sixth P-type MOS transistor, wherein a gate is connected to the output terminal of the first inverter, a source is connected to the power supply, and a drain is connected to the second precharge node;

a seventh P-type MOS transistor, wherein a gate is connected to the second precharge node, a source is connected to the power supply, and a drain is connected to the first precharge node;

a 17th N-type MOS transistor, wherein a gate is connected to the second input data signal and a drain is connected to the first precharge node; and an 18th N-type MOS transistor, wherein a gate is connected to the input data signal selection signal, a drain is connected to a source of the 17th N-type MOS transistor, and a source is connected to the drain of the first N-type MOS transistor.

12. A semiconductor integrated circuit as claimed in claim 9, wherein the feedback circuit comprises:

an eighth P-type MOS transistor, wherein a gate is connected to the output data signal and a source is connected to a power supply;

a tenth P-type MOS transistor, wherein a gate is connected to the first input data signal, a drain is connected to the second feedback signal, and a source is connected to a drain of the eighth P-type MOS transistor;

a tenth N-type MOS transistor, wherein a gate is connected to the first input data signal and a drain is connected to the second feedback signal;

an 11th N-type MOS transistor, wherein a gate is connected to the output data signal, a drain is connected to the second feedback signal, and a source is connected to a source of the tenth N-type MOS transistor;

an 11th P-type MOS transistor, wherein a gate is connected to the input data signal selection signal and a source is connected to the power supply;

a 12th N-type MOS transistor, wherein a gate is connected to the input data signal selection signal, a source is grounded, and a drain is connected to a drain of the 11th P-type MOS transistor;

a 13th N-type MOS transistor, wherein a gate is connected to the drain of the 12th N-type MOS transistor, a source is grounded, and a drain is connected to the source of the tenth N-type MOS transistor;

a 12th P-type MOS transistor, wherein a gate is connected to the drain of the 12th N-type MOS transistor, a source is connected to the power supply, and a drain is connected to the second feedback signal;

a 13th P-type MOS transistor, wherein a gate is connected to the data retaining node, a source is connected to the drain of the 11th P-type MOS transistor, and a drain is connected to the first feedback signal;

a 14th N-type MOS transistor, wherein a gate is connected to the input data signal selection signal, a drain is connected to the first feedback signal, and a source is grounded; and a 15th N-type MOS transistor, wherein a gate is connected to the data retaining node, a drain is connected to the first feedback signal, and a source is grounded.

13. A semiconductor integrated circuit as claimed in claim 4, wherein regarding spatial distances in terms of physical layout in the latch circuit, a distance between the first N-type MOS transistor and the third N-type MOS transistor is set to be shorter than a distance between the first N-type MOS transistor and the fifth N-type MOS transistor.

14. A semiconductor integrated circuit as claimed in claim 4, wherein
regarding threshold voltages of the MOS transistors in the latch circuit,
the threshold voltages of the second N-type MOS transistor and the third N-type MOS transistor are set to be lower than the threshold voltages of the fourth N-type MOS transistor and the fifth N-type MOS transistor.

15. A semiconductor integrated circuit as claimed in claim 4, wherein
in the latch circuit,
a circuit block including the first N-type MOS transistor, the second N-type MOS transistor and the third N-type MOS transistor is formed on a semiconductor substrate,
another circuit block including the fourth N-type MOS transistor and the fifth N-type MOS transistor is formed on the semiconductor substrate,
diffusion regions respectively constituting the sources and the drains of the first N-type MOS transistor, the second N-type MOS transistor and the third N-type MOS transistor and gate electrodes thereof are sequentially formed in a transverse direction with respect to other adjacent circuit blocks, and
diffusion regions respectively constituting the sources and the drains of the fourth N-type MOS transistor and the fifth N-type MOS transistor are sequentially formed in the transverse direction with respect to the other adjacent circuit blocks.

16. A semiconductor integrated circuit as claimed in claim 15, wherein
in the latch circuit,
in the case in which characteristics of the diffusion regions are deteriorated due to a shallow trench isolation region formed between the adjacent circuit blocks, the diffusion region constituting the source of the fourth N-type MOS transistor and the diffusion region constituting the drain of the fifth N-type MOS transistor are formed on the shallow-trench-isolation-region side.

17. A semiconductor integrated circuit as claimed in claim 15, wherein
in the latch circuit, in the case in which characteristics of the diffusion regions are improved due to a shallow trench isolation region formed between the adjacent circuit blocks, the diffusion regions constituting the drains of the first N-type MOS transistor, the second N-type MOS transistor and the third N-type MOS transistor are formed on the shallow-trench-isolation-region side.

18. A semiconductor integrated circuit as claimed in claim 4, wherein
the latch circuit is configured such that a potential of the source of the first N-type MOS transistor, a potential of the source of the sixth N-type MOS transistor and a potential of the source of the seventh N-type MOS transistor are raised when the clock signal is halted.

19. A semiconductor integrated circuit as claimed in claim 1, wherein
a power supply for the latch circuit and a power supply for the retaining circuit and the feedback circuit are independent from each other and separately controllable.

20. A semiconductor integrated circuit as claimed in claim 4, wherein
the latch circuit is configured such that
substrate potentials of the second N-type MOS transistor and the third N-type MOS transistor are set to be lower than a ground potential when the first feedback signal is at a level,
the substrate potentials of the second N-type MOS transistor and the third N-type MOS transistor are set to be higher than the ground potential when the first feedback signal is at a "H" level,
substrate potentials of the fourth N-type MOS transistor and the fifth N-type MOS
transistor are set to be lower than the ground potential when the second feedback signal is at the "L" level, and
the substrate potentials of the fourth N-type MOS transistor and the fifth N-type MOS transistor are set to be higher than the ground potential when the second feedback signal is at the "H" level.

21. A semiconductor integrated circuit as claimed in claim 10, wherein
the latch circuit is configured such that P-type MOS transistors are replaced by N-type MOS transistors, the N-type MOS transistors are replaced by the P-type MOS transistors, a power supply is replaced by a ground, and the ground is replaced by the power supply when the first and second feedback signals are signals of an inversion logic.

22. A semiconductor integrated circuit as claimed in claim 1, wherein
the feedback circuit is configured such that the feedback signal generated based on the logic combinations of the input data signal and output data signal is retained when the clock signal is at a "L" level, and outputs the retained feedback signal to the latch circuit when the clock signal is at a "H" level.

23. A semiconductor integrated circuit as claimed in claim 1, wherein the feedback circuit comprises:
a path gate, the path gate being turned on when the clock signal is at a "L" level; and
a feedback signal latch circuit including a circuit for retaining the feedback signal.

24. A semiconductor integrated circuit comprising:
a latch circuit including a first NAND-type dynamic circuit and a second NAND-type dynamic circuit, the latch circuit inputting therein an input data signal, a clock signal, and a feedback signal, and outputting an output data signal;
a retaining circuit, the retaining circuit retaining the output data signal; and
a feedback circuit, the feedback circuit inputting therein the input data signal and the output data signal to thereby generate the feedback signal based on logic combinations of the input data signal and output data signal, wherein
whether charge or discharge of a precharge node in the second NAND-type dynamic circuit is determined based on the clock signal and the feedback signal.

25. A semiconductor integrated circuit comprising:
a latch circuit, the latch circuit inputting therein an input data signal, a clock signal, and a feedback signal, and outputting an output data signal; and
a feedback circuit, the feedback circuit inputting therein the input data signal and the output data signal to thereby generate the feedback signal based on logic combinations of the input data signal and output data signal, wherein
signal transmission inside the latch circuit is stopped by means of the feedback signal when the clock signal is supplied to the latch circuit.

26. A semiconductor integrated circuit comprising:
a latch circuit, the latch circuit inputting therein a plurality of input data signals, an input data signal selection signal, a clock signal, and a feedback signal, and outputting an output data signal; and a feedback circuit, the feedback circuit inputting therein the input data signals, the input data signal selection signal, and the output data signal to thereby generate the feedback signal based on logic combinations of the input data signal selected by the input data signal selection signal and the output data signal, wherein signal transmission inside the latch circuit is stopped by means of the feedback signal in compliance with the input data signal selected by the input data signal selection signal when the clock signal is supplied to the latch circuit.

27. A semiconductor integrated circuit comprising:

a latch circuit, the latch circuit inputting therein a first input data signal, a second input data signal, an input data signal selection signal, a clock signal, and a feedback signal, and outputting an output data signal, wherein the first input data signal is used as an effective data signal when a value of the input data signal selection signal is one of the "H" level and "L" level, and the second input data signal is used as the effective data signal when the value of the input data signal selection signal is the other of "H" level and "L" level; and a feedback circuit, the feedback circuit inputting therein the first input data signal, the input data signal selection signal, and the output data signal;

the feedback circuit always outputting a constant value as the feedback signal when the second input data signal is the effective data signal, wherein signal transmission inside the latch circuit is stopped by means of the feedback signal regardless of whether the clock signal is discontinued when the first input data signal is the effective data signal, and the signal transmission inside the latch circuit is constantly activated when the second input data signal is the effective data signal.

* * * * *